United States Patent
Cull et al.

(10) Patent No.: US 9,805,838 B2
(45) Date of Patent: Oct. 31, 2017

(54) ORGANIC SEMICONDUCTOR FORMULATION

(75) Inventors: Toby Cull, Romsey (GB); Miguel Carrasco-Orozco, Winchester (GB)

(73) Assignee: MERCK PATENT GMBH, Darmstadt (DE)

(*) Notice: Subject to any disclaimer, the term of this patent is extended or adjusted under 35 U.S.C. 154(b) by 304 days.

(21) Appl. No.: 14/240,887

(22) PCT Filed: Jul. 28, 2012

(86) PCT No.: PCT/EP2012/003225
§ 371 (c)(1),
(2), (4) Date: May 2, 2014

(87) PCT Pub. No.: WO2013/029733
PCT Pub. Date: Mar. 7, 2013

(65) Prior Publication Data
US 2014/0230900 A1 Aug. 21, 2014

(30) Foreign Application Priority Data
Aug. 26, 2011 (EP) .................... 11006995

(51) Int. Cl.
*H01B 1/20* (2006.01)
*H01L 51/00* (2006.01)
(Continued)

(52) U.S. Cl.
CPC ........... *H01B 1/20* (2013.01); *H01L 51/0003* (2013.01); *H01L 51/0007* (2013.01);
(Continued)

(58) Field of Classification Search
CPC ......... H01B 1/04; H01B 1/124; H01B 1/125; H01B 1/127; H01B 1/128; H01B 1/20;
(Continued)

(56) References Cited

U.S. PATENT DOCUMENTS

| 6,994,893 B2 | 2/2006 | Spreitzer et al. |
| 7,186,468 B2 * | 3/2007 | Iwanaga ............... H01L 51/006 313/504 |

(Continued)

FOREIGN PATENT DOCUMENTS

| DE | WO 2011076324 A1 * | 6/2011 | ......... H01L 51/0003 |
| GB | WO 2011098113 A2 * | 8/2011 | ........... C07D 495/04 |

(Continued)

OTHER PUBLICATIONS

International Search Report dated Oct. 5, 2012 issued in corresponding PCT/EP2012/003225 application (pp. 1-3).
F. Padinger et al., "Fabrication of Large Area Photovoltaic Devices Containing Various Blends of Polymer and Fullerene Derivatives by Using the Doctor Blade Technique", Opto-Electronics Review, vol. 8, No. 4 (2000) pp. 280-283.
P. Schilinsky et al., "Performance Analysis of Printed Bulk Heterojunction Solar Cells", Advanced Functional Materials, vol. 16 (2006) pp. 1669-1672.
(Continued)

*Primary Examiner* — Harold Pyon
*Assistant Examiner* — Matthew R Diaz
(74) *Attorney, Agent, or Firm* — Millen White Zelano and Branigan, PC; Csaba Henter; John Sopp

(57) ABSTRACT

The invention relates to a formulation comprising p-type and n-type organic semiconductors (OSC) and one or more organic solvents, its use for the preparation of organic electronic (OE) devices, especially for bulk heterojunction (BHJ) organic photovoltaic (OPV) devices, to a process for preparing an OE device, especially a BHJ OPV device, using the formulation, and an OE device, especially a BHJ OPV device, prepared using such a process or formulation.

15 Claims, 6 Drawing Sheets

(51) Int. Cl.
*H01L 51/42* (2006.01)
*B82Y 10/00* (2011.01)

(52) U.S. Cl.
CPC ...... *H01L 51/0036* (2013.01); *H01L 51/0046* (2013.01); *H01L 51/0047* (2013.01); *H01L 51/4253* (2013.01); *B82Y 10/00* (2013.01); *H01L 51/0043* (2013.01); *Y02E 10/549* (2013.01)

(58) Field of Classification Search
CPC ... H01B 1/24; H01L 51/0007; H01L 51/0032; H01L 51/0035; H01L 51/0036; H01L 51/0037; H01L 51/0038; H01L 51/0039; H01L 51/0043; H01L 51/0046; H01L 51/0047
See application file for complete search history.

(56) References Cited

U.S. PATENT DOCUMENTS

| | | | |
|---|---|---|---|
| 7,405,255 B2 | 7/2008 | Spreitzer et al. | |
| 7,704,785 B2 | 4/2010 | Steiger et al. | |
| 7,820,077 B2 | 10/2010 | Spreitzer et al. | |
| 8,038,903 B2 | 10/2011 | Spreitzer et al. | |
| 2003/0116755 A1* | 6/2003 | Takahashi | C07C 17/16 252/500 |
| 2004/0225056 A1 | 11/2004 | Spreitzer et al. | |
| 2006/0127592 A1 | 6/2006 | Spreitzer et al. | |
| 2007/0173578 A1 | 7/2007 | Spreitzer et al. | |
| 2008/0265214 A1 | 10/2008 | Steiger et al. | |
| 2009/0032808 A1 | 2/2009 | Bazan et al. | |
| 2009/0074974 A1 | 3/2009 | Yokoi et al. | |
| 2009/0108255 A1 | 4/2009 | Bazan et al. | |
| 2009/0194167 A1* | 8/2009 | Brabec | A62C 3/00 136/261 |
| 2010/0043876 A1 | 2/2010 | Tuttle et al. | |
| 2010/0213455 A1 | 8/2010 | James et al. | |
| 2012/0074360 A1* | 3/2012 | Funyuu | H01L 51/0035 252/500 |
| 2012/0100667 A1* | 4/2012 | Koutake | H01L 51/0022 438/99 |
| 2012/0181530 A1* | 7/2012 | Funyuu | C08G 61/12 257/40 |
| 2012/0193617 A1* | 8/2012 | Urano | C08G 61/12 257/40 |
| 2013/0161594 A1 | 6/2013 | James et al. | |

FOREIGN PATENT DOCUMENTS

| | | | | |
|---|---|---|---|---|
| GB | WO 2011147523 A1 * | 12/2011 | | C09K 11/06 |
| JP | 2003-308969 A | 10/2003 | | |
| JP | 2008-545816 A | 12/2008 | | |
| JP | WO 2010113931 A1 * | 10/2010 | | H01L 51/0007 |
| JP | WO 2010140553 A1 * | 12/2010 | | H01L 51/0035 |
| JP | WO 2011052698 A1 * | 5/2011 | | C08G 61/12 |
| WO | 02/072714 A1 | 9/2002 | | |
| WO | 2005/083814 A1 | 9/2005 | | |
| WO | 2005/112145 A1 | 11/2005 | | |
| WO | 2009/049744 A1 | 4/2009 | | |
| WO | 2010/021921 A1 | 2/2010 | | |
| WO | 2012/147208 A1 | 11/2012 | | |

OTHER PUBLICATIONS

J. Peet et al., "The Role of Processing in the Fabrication and Optimization of Plastic Solar Cells", Advanced Materials, vol. 21 (2009) pp. 1521-1527.
C. Muller et al., "Binary Organic Photovoltaic Blends: A Simple Rationale for Optimum Compositions", Advanced Materials, vol. 20 (2008) pp. 3510-3515.
B. Lei et al., "Quantifying the Relation Between the Morphology and Performance of Polymer Solar Cells Using Monte Carlo Simulations", Journal of Applied Physics, vol. 104 (2008) pp. 024504-1-024504-6.
C. Hoth et al., "On the Effect of Poly(3-Hexylthiophene) Regioregularity on Inkjet Printed Organic Solar Cells", Journal of Materials Chemistry, vol. 19 (2009) pp. 5398-5404.
F. Zhang et al., "Influence of Solvent Mixing on the Morphology and Performance of Solar Cells Based on Polyfluorene Copolymer/Fullerene Blends", Advanced Functional Materials, vol. 16 (2006) pp. 667-674.
C. Lin et al., "Optimization of the Active-Layer Morphology with a Non-Halogenic Solvent for Bulk-Heterojunction Polymer Solar Cells", Synthetic Metals, vol. 160 (2010) pp. 2643-2647.
S.R. Tseng et al., "Multilayer Polymer Light-Emitting Diode and Solar Cell by Blade Coating".
M. Rispens et al., "Influence of the Solvent on the Crystal Structure of PCBM and the Efficiency of MDMO-PPV: PCBM 'plastic' Solar Cells", Chem. Commun., (2003) pp. 2116-2118.
T. Aernouts et al., "Polymer Based Organic Solar Cells Using Ink-Jet Printed Active Layers", Applied Physics Letters, vol. 92 (2008) pp. 033306-033306-3.
S.E. Shaheen et al., "2.5% Efficient Organic Plastic Solar Cells", Applied Physics Letters, vol. 78, No. 6 (Feb. 5, 2001) pp. 841-843.
J. Liu et al., "Solvation-Induced Morphology Effects on the Performance of Polymer-Based Photovoltaic Devices", Advanced Functional Materials, vol. 11, No. 6 (Dec. 2001) pp. 420-424.
S. Nilsson et al., "Morphology and Phase Segregation of Spin-Casted Films of Polyfluorene/PCBM Blends", Macromolecules, vol. 40 (2007) pp. 8291-8301.
S.H. Chan et al., "Morphology Evolution of Spin-Coated Films of Poly(thiophene-phenylene-thiophene) and [6,6]-Phenyl-C71-butyric Acid Methyl Ester by Solvent Effect", Macromolecules, vol. 43 (2010) pp. 3399-3405.
N.D. Treat et al., "Interdiffusion of PCBM and P3HT Reveals Miscibility in a Photovoltaically Active Blend", Advanced Energy Materials, vol. 1 (2011) pp. 82-89.
Y. He et al., "Indene-C60 Bisadduct: A New Acceptor for High-Performance Polymer Solar Cells", J. Am. Chem. Soc., vol. 132 (2010) pp. 1377-1382.
K.M. Coakley et al., "Conjugated Polymer Photovolatic Cells", Chemical Materials, vol. 16 (2004) pp. 4533-4542.
C. Waldauf et al., "Highly Efficient Inverted Organic Photovoltaics Using Solution Based Titanium Oxide as Electron Selective Contact", Applied Physics Letters, vol. 89 (2006) pp. 233517-233517-3.
Yurong, G. et al., "Bulk Heterojunction Polymer Solar Cells," Progress in Chemistry, May 2011, vol. 23, No. 5, pp. 991-1013.
Notification of Reasons for Refusal (1st Office Action) dated Aug. 9, 2016 issued in corresponding JP 2014-526404 application (2 pages).
Machine Translation of JP 2003-308969 published Oct. 31, 2003.
Machine Translation of WO 2012/147208 published Nov. 1, 2012.

* cited by examiner

ORGANIC SEMICONDUCTOR FORMULATION

FIELD OF THE INVENTION

The invention relates to a formulation comprising p-type and n-type organic semiconductors (OSC) and one or more organic solvents, its use for the preparation of organic electronic (OE) devices, especially for bulk heterojunction (BHJ) organic photovoltaic (OPV) devices, to a process for preparing an OE device, especially a BHJ OPV device, using the formulation, and an OE device, especially a BHJ OPV device, prepared using such a process or formulation.

BACKGROUND AND PRIOR ART

When producing BHJ OPV cells it is important that the separation of donor and acceptor in the active layer is optimised to enable high power conversion efficiency. Typically a mixture of donor and acceptor are advantageously coated from a solvent, and phase separation then occurs during the drying process. A number of different coating techniques are possible, like spin coating, blade coating, etc. Blade coating is preferentially used due the ease of transfer to larger industrial coating processes (see F. Padinger, C. J. Brabec, T. Fromherz, J. C. Hummelen, N. S. Sariciftci, *Opto-Electron. Rev.* 2000, 8, 280), and because of its comparability to spin coating (see P. Schilinsky, C. Waldauf, C. J. Brabec, *Adv. Funct. Mater.,* 2006, 16, 1669). The coating technique may also have an impact on the phase separation, but this usually tends to be of less relevance compared to the physical parameters of the materials and solvents involved in the process.

Typical donor/acceptor blends described in prior art include as a donor polymer for example poly(3-hexylthiophene) (P3HT), poly[2,6-(4,4-bis(2-ethylhexyl)-4H-cyclopenta[2,1-b;3,4-b']-dithiophene)-alt-4,7-(2,1,3-benzothiadiazole)] (PCPDTBT) or a-PTPTBT as shown below, and as acceptor for example a $C_{60}$ or $C_{70}$ fullerene or a substituted $C_{60}$ or $C_{70}$ fullerene, like for example $C_{60}$PCBM as shown below or $C_{70}$PCBM.

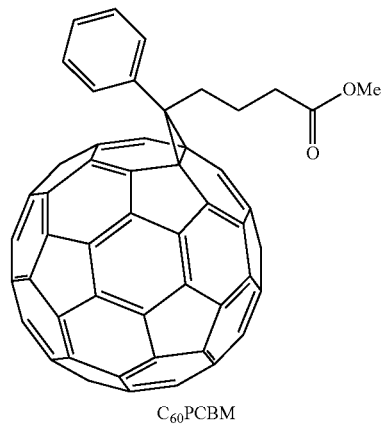

$C_{60}$PCBM

Due to the limited solubility especially of the acceptor component, the donor/acceptor blends tend to be processed from solutions of chlorinated solvent such as chlorobenzene, trichlorobenzene, dichlorobenzene or chloroform, and the majority of the literature gives examples of P3HT and C60/C70 blends coated from o-dichlorobenzene (DCB) or chlorobenzene.

The morphology and phase separation of this P3HT/PCBM system has been extensively studied by AFM techniques, and it has been shown that forming the correct morphology is critical to enable efficient charge separation and collection in the cell (see Peet, J.; Senatore, M. L.; Heeger, A. J.; Bazan, G. C. *Adv. Mater.* 2009, 21, 1521-1527). It has also been stated that the phase diagram for the two components is likely to be unique for each donor/acceptor system and to-date remains to be fully described for

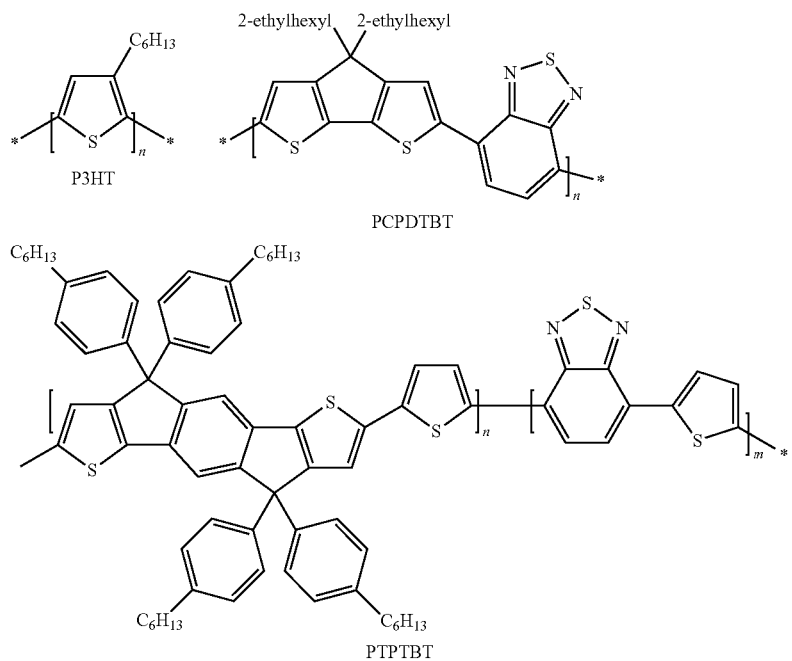

any one system, making obtaining the correct morphology in new blends a major challenge (see C. Muller, T. A. M. Ferenczi, M. Campoy-Guiles, J. M. Frost, B. B. C. Bradley, P. Smith, N. Stingelin-Stutzmann, J. Nelson, *Adv. Mater.* 2008, 20, 3510, and B. Lei, Y. Yao, A. Kumar, Y. Yang, V. Ozolins, *J. Appl. Phys.* 2008, 104, 024504).

In the drive to further improve the power conversion efficiency (PCE) of OPV devices, it is desirable that the morphology of the donor and acceptor blend, which forms the heterojunction responsible for the transport of charge in the OPV device, can be intentionally manipulated. The literature illustrates many examples of ways in which this has been attempted, for example by modification of the solvent and solvent blends used in preparation of the active layer. A good overview of the area is given in the paper by Peet, J.; Senatore, M. L.; Heeger, A. J.; Bazan, G. C. *Adv. Mater.* 2009, 21, 1521-1527.

In BHJ OPV devices the choice of the solvent, the polymers used and the deposition conditions/techniques determine the phase separation morphology between the donor polymer and the acceptor, usually PCBM. High PCE has been obtained in the literature by optimizing the blends and coating conditions from donor/acceptor formulations mainly using chlorinated solvents.

However, when moving from research to industrial processes, chlorinated solvents are not preferred, and do therefore need to be replaced by solvents that are more suitable for large scale coating applications. The aim is therefore to use a non-chlorinated solvent while still retaining the high PCE.

Currently, there is limited literature regarding the use of non-chlorinated solvents for forming BHJ OPV devices. In some cases non-chlorinated solvents are used together in a blend with chlorinated solvents, (see C. Hoth et al., *J. Mater. Chem.* 2009, 19, 5398, F. Zhang et al., *Adv. Funct. Mater.* 2006, 16, 667) but only a few examples of high efficiency OPV devices were reported. In some cases, data obtained using solutions of P3HT/PCBM in alternative solvents such as toluene, xylene, cyclohexanone or tetralin are shown, but compared to chlorinated solvents these generally show worse performance. (see C. Lin et al., *Synth. Metals.* 2010, 160, 2643, *Pure and Applied Chem.* 2008, 80, 2151, S.-R. Tseng et al., *Organic Electronics,* 2009, 10, 74, M. Rispens et al., *Chem. Com.,* 2003, 2116, T. Aernouts et al., *Appl. Phys. Lett.* 2008, 92, 033306, S. E. Shaheen et al., *Appl. Phys. Lett.* 2001, 78, 841, J. Liu et al., *Adv. Funct. Mater.* 2001, 11, 420) This has been attributed to the poor solubility of both the P3HT and the PCBM in these alternative solvents, which results in rough films containing large crystallites of PCBM which disrupt the morphology (see Nilsson, S.; Bernasik, A.; Budkowski, A.; Moons, E. *Macromolecules* 2007, 40, 8291, and Chan, S.; Hsiao, Y.; Hung, L.; Hwang, G.; Chen, H.; Ting, C; Chen, C. *Macromolecules,* 2010, 43, 3399).

US 2010/0043876 A1 discloses a composition for forming an active layer in an OPV device comprising a p-type material like for example P3HT, an n-type material like for example a $C_{60}$ fullerene, a first solvent which comprises at least one alkylbenzene (like xylene or toluene) or benzocyclohexane (i.e. tetralin), and a second solvent which is different from the first solvent and comprises at least one carbocyclic compound. It is further disclosed that the solvents can be selected according to their Hansen Solubility Parameters. The boiling point of the first solvent can be greater than that of the second solvent or vice versa. The exemplified solvent systems include o-xylene/tetralin, toluene/salicylaldehyde, o-xylenesalicylaldehyde, o-xylene/tetralin/salicylaldehyde, toluene/methyl salicylate, toluene/anisole, tetralin/toluene/salicylaldehyde, and tetralin/toluene/anisaldehyde.

However, the non-chlorinated solvent systems as disclosed in prior art do still have several drawbacks and leave room for further improvement. For example, regarding the solvent systems disclosed in US 2010/0043876 A1, the P3HT used therein is known to have a limited solubility in various organic solvents, and therefore there is a limited scope for solvent manipulation to influence phase separation. US 2010/0043876 A1 describes how adding a second solvent which constitutes a small percentage of the ink composition can modify the efficiency of the device. The second solvent is generally a high boiling solvent, and has poor solubility for the P3HT component, causing it to crystallise out of solution more readily and hence tending to a rougher active layer, as shown by AFM imaging.

A small amount of a solvent with poor solubility for one of the components has the effect of increasing the roughness, which implies that there is an increase in the size of the crystals/grain boundarys formed in the P3HT or PCBM. One possible reason for very rough films is the formation of crystallites which are increasing in size and can lead to large PCBM or P3HT islands, and therefore does not give the optimum phase separated morphology and performance.

In US 2010/0043876 A1 the addition of a second solvent is linked with the increase in roughness and the increased performance in a system containing P3HT. However, as will be shown in the present invention, drawing a universal link between surface roughness and performance is not always valid. The examples of the present invention demonstrate that it is also possible to improve device performance even if there is no significant change in the surface roughness of the active layer.

It is desirable to provide solvent systems that increase the performance but do not necessarily also increase the roughness of the active layer to avoids potential issues when further layers are deposited on top of the active layer.

In addition, the polymer utilised in the embodiments presented in US 2010/0043876 A1 is P3HT, which is a special case in the field of OPV due to its semi-crystalline/crystalline nature, whereas recently developed low band-gap polymers, which are required for higher efficiencies, are typically more amorphous in character. Therefore improved solvent systems are required that are specifically developed for these new polymers.

Also, the solvents described in US 2010/0043876 A1, which are used as replacement for chlorinated solvents such as DCB, appear to have disadvantages compared to DCB regarding device performance.

Thus, in the examples disclosed in US 2010/0043876 A1, P3HT is formulated with C-60 indene using a range of non-chlorinated solvent mixtures with varying composition. A comparison device prepared by using using DCB as solvent is not disclosed therein. However, it has been shown in literature that when P3HT/C-60 indene C60 is coated from DCB, an average of 5.44% PCE can be achieved (see Y. He et al., *J. Am. Chem. Soc,* 2010, 132, 1377). In contrast thereto, when P3HT/C-60 indene is coated from toluene as exemplified in US 2010/0043876 A1 as a single solvent in replacement for DCB, this shows a decreased PCE of 3.73%. The use of dual/terniary solvent mixtures as further exemplified in US 2010/0043876 A1 shows that the performance of P3HT/C-60 indene can be improved, however, neither of the formulations exemplified can reach or exceed the performance obtained when using DCB as solvent.

In conclusion, the approach as described in US 2010/0043876 A1 to replace DCB by alternative solvents is not definitive, is limited to a specific material, and appears to be of limited benefit considering the PCE values achieved.

Therefore, there is still a need for improved solvent systems and OSC formulations which can be used as OSC inks for the manufacture of OE devices, especially OFETs and OPV cells, which allow a broad, but precise selection of solvents that have suitable viscosity, are non-chlorinated and do not adversely affect the properties and performance of the OE device and its components, like the roughness of the active layer or the PCE of the device.

One aim of the present invention is to provide solvent systems and OSC formulations having these advantages. Another aim is to provide improved OE/OPV devices obtainable from such OSC formulations. Further aims are immediately evident to the person skilled in the art from the following description.

The inventors of the present invention have found these aims can be achieved, and the above-mentioned problems can be solved, by providing solvent systems and OSC formulations as claimed in the present invention.

In particular, the inventors of the present invention have found that an OSC formulation can be prepared utilising solvent mixtures to affect the phase separation of the two components. This was confirmed by observing a difference in performance between OE devices prepared from the same OSC material in different solvent systems, when all remaining factors are kept constant and only the formulation composition is varied.

SUMMARY OF THE INVENTION

The invention relates to a formulation comprising at least one p-type organic semiconductor, at least one n-type organic semiconductor, at least one first solvent selected from the group consisting of alkylated tetralin, alkylated naphthalene and alkylated anisole, and optionally at least one second solvent which is different from said first solvent.

The second solvent is preferably selected from the group consisting of alkylated benzene, alkoxylated benzene, indane, alkylated indane, alkoxylated indane, tetralin, alkylated tetralin, naphthalene, alkylated naphthalene, anisole and alkylated anisole.

Further preferred second solvents are selected from the group consisting of linear or cyclic ketones, aromatic and/or aliphatic ethers, aromatic alcohols, optionally substituted thiophenes, benzothiophenes, alkoxylated naphthalene, substituted benzothiazoles, alkyl benzoates, aryl benzoates.

The invention further relates to the use of a formulation as described above and below for the preparation of an organic electronic device.

The invention further relates to a process of preparing an organic electronic device comprising the following steps
a) providing an anode,
b) providing a cathode,
c) providing a formulation as described above and below between the anode and the cathode, and removing any solvents present in the formulation to produce a dry thin layer,
wherein one of steps a) and b) may also be carried out after step c).

The invention further relates to an organic electronic device comprising
an anode,
a cathode,
an active layer formed from a formulation as described above and below or formed by step c) of the process as described above and below.

Preferably the organic electronic (OE) device is an organic photovoltaic (OPV) device, semitransparent OPV, flexible OPV, organic photodiode, organic laser diode (O-laser), Schottky diode, photoconductor, electrophotographic device, organic memory device, organic photo-transistor, organic field effect transistor (OFET) or organic light emitting diode (OLED).

Very preferably the OE device is an all organic OPV device in any possible architecture. Especially preferably the OE device is a bulk heterojunction (BHJ) OPV device, including all possible relative positions of anode and cathode.

TERMS AND DEFINITIONS

Figure 1:
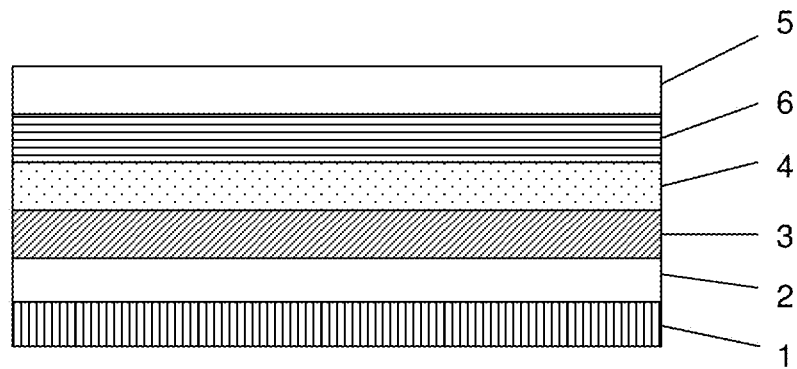
FIG. 1 exemplarily and schematically depicts the structure of an OPV device according to the present invention.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

Above and below, the term "polymer" generally means a molecule of high relative molecular mass, the structure of which essentially comprises the multiple repetition of units derived, actually or conceptually, from molecules of low relative molecular mass (PAC, 1996, 68, 2291). The term "oligomer" generally means a molecule of intermediate relative molecular mass, the structure of which essentially comprises a small plurality of units derived, actually or conceptually, from molecules of lower relative molecular mass (PAC, 1996, 68, 2291). In a preferred sense according to the present invention a polymer means a compound having >1, preferably ≥5 repeating units, and an oligomer means a compound with >1 and <10, preferably <5, repeating units.

The terms "repeating unit" and "monomeric unit" mean the constitutional repeating unit (CRU), which is the smallest constitutional unit the repetition of which constitutes a regular macromolecule, a regular oligomer molecule, a regular block or a regular chain (PAC, 1996, 68, 2291).

The terms "donor" and "acceptor", unless stated otherwise, mean an electron donor or electron acceptor, respectively.

The terms "conducting", "conductive" etc. refer to electrical conductivity.

The term "conjugated" means a compound containing mainly C atoms with $sp^2$-hybridisation (or optionally also sp-hybridisation), which may also be replaced by hetero atoms. In the simplest case this is for example a compound with alternating C—C single and double (or triple) bonds, but does also include compounds with units like 1,3-phenylene. "Mainly" means in this connection that a compound with naturally (spontaneously) occurring defects, or with defects included by design, which may lead to interruption of the conjugation, is still regarded as a conjugated compound.

Also included in the meaning of "conjugated" are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom). The term "conjugated linking group" means a group connecting two rings (usually aromatic rings) consisting of C atoms or hetero atoms with $sp^2$-hybridisation or sp-hybridisation. See also "IUPAC Compendium of Chemical terminology, Electronic version".

The term "polymer" includes homopolymers and copolymers, e.g. statistical, alternating or block copolymers. In addition, the term "polymer" as used hereinafter does also include dendrimers, which are typically branched macromolecular compounds consisting of a multifunctional core group onto which further branched monomers are added in a regular way giving a tree-like structure, as described for example in M. Fischer and F. Vögtle, *Angew. Chem., Int. Ed.* 1999, 38, 885.

Unless stated otherwise, the molecular weight is given as the number average molecular weight $M_n$ or weight average molecular weight $M_w$, which is determined by gel permeation chromatography (GPC) against polystyrene standards in eluent solvents such as tetrahydrofuran, trichloromethane (TCM, chloroform), chlorobenzene or 1,2,4-trichlorobenzene. Unless stated otherwise, trichloromethane is used as solvent. The degree of polymerization (n) means the number average degree of polymerization given as $n=M_n/M_U$, wherein $M_U$ is the molecular weight of the single repeating unit as described in J. M. G. Cowie, *Polymers: Chemistry & Physics of Modern Materials*, Blackie, Glasgow, 1991.

"Small molecule" means a monomeric, i.e. non-polymeric compound.

Unless stated otherwise, percentages of solids are percent by weight ("wt. %"), percentages or ratios of liquids (like e.g. in solvent mixtures) are percent by volume ("vol. %"), and temperatures are given in degrees Celsius (° C.), "room temperature (RT)" means 20° C., "b.p." means boiling point, "atmospheric pressure" means 760 Torr or 1013 hPa.

Unless stated otherwise, above and below all physical properties and values refer to a temperature of 20° C.

DETAILED DESCRIPTION OF THE INVENTION

The present application provides an OSC formulation and a method of its preparation, which can be used to prepare an active OSC layer in an OE device, preferably a BHJ OPV device, using solvents and solvent blends that are free of chlorinated components. The device performance is expressed in terms of power conversion efficiency (PCE) values and J/V characteristics, from which $J_{sc}$, $V_{oc}$ and FF can be identified, that are similar or improved compared to a device wherein the active semiconducting layer is prepared from a solution using chlorinated solvents such as o-dichlorobenzene (DCB).

The performance of the formulation according to the present invention comprising one or more non-chlorinated solvents is preferably equivalent or higher than that obtained from a similar formulation using a chlorinated solvent.

The solvent systems and formulations according to the present invention use single solvents generally possessing a higher boiling point compared to the non-chlorinated solvents exemplified in prior art. Alternatively the solvent systems and formulations according to the present invention use a blend of two or more solvents in which the majority component has a high boiling point, and the minority component is incorporated at larger percentages compared to the solvent blends exemplified in prior art. Additionally the minority component has a boiling point lower than, or similar as, the majority component and generally has a good solubility, preferably better than 1 mg/ml at 100° C., for either of the semiconducting constituents of the BHJ.

When this solvent system is used with an OSC material which is a blend of a p-type and an n-type OSC, for example a p-type OSC polymer as donor and a fullerene as acceptor, phase separation of the n-type and p-type OSC components can intentionally be induced by the evaporation of the lower boiling point solvent component and then continued through the slow drying of the higher boiling solvent component, allowing polymer reorganisation.

As a consequence of this method, little effect of the solvent on the surface roughness of the OPV film is observed. This can be explained as the solubility of the p-type and n-type OSC is relatively high in the solvents used and therefore the growth of larger, more disordered crystallites and domains of either the polymer or the fullerene is not observed, and hence the roughness of the OSC layer surface does not increase.

When using a state of the art high solubility, low band gap donor polymer as described in the examples together with a fullerene, for example PC60BM, both single solvent and dual solvent systems can be provided as a replacement for DCB, which still show equivalent or even higher OPV device performance compared to the performance of an OPV device prepared using a DCB formulation.

Furthermore, when using a state of the art high solubility, low band gap donor polymer as described in the examples and non-chlorinated solvents as described in the present application, an increase in $V_{oc}$ over of the OPV device could be observed compared to an OPV device prepared using a DCB formulation. This is demonstrated in the examples.

Without wishing to be bound to a specific theory the inventors propose that this increase is associated to a better ordering of the blend components in the layer, resulting in a decreased grain size and more uniform phase separation. This is achieved through the choice of high boiling point solvent, when the solvent evaporation time is extended and so the polymer chains can organize into a more optimal morphology and phase separation is a slower, more controlled process. Such reorganisation and phase separation can also be achieved using a lower boiling point solvent by optimisation of coating parameters and coating temperatures.

This improvement is not observed in P3HT as the optimum morphology can only be obtained through thermal processing after the film has been dried. This process results in the intermixing of the P3HT/PCBM destroying the phase separation morphology formed during drying (see N. Treat et al., *Adv. Energy. Mater.* 2011, 1, 82).

In a preferred embodiment of the present invention the formulation contains a single solvent. In another preferred embodiment the formulation contains a blend of one or more first solvent(s) and one or more second solvent(s).

When depositing the formulation onto a substrate and removing the solvent(s), the p-type OSC and the n-type OSC undergo phase separation and thus form the heterojunction morphology. By controlling the phase separation it is also possible to control the morphology and/or crystallinity of the heterojunction.

This allows improvement of heterojunction morphology between the p-type (donor) component and the n-type (acceptor) component, hence resulting in improvement of the PCE Further improvement can be achieved by optimization of the ratios of each solvent in the solvent blend, and through optimization of the processing conditions and processing/drying temperatures of such blends.

In a preferred embodiment the first (or majority) solvent is selected such that it has a higher solubility for the n-type OSC than for the p-type OSC, and the second (or minority) solvent is selected such that it has a higher solubility for the p-type OSC than for the n-type OSC. In addition, the first solvent in this preferred embodiment preferably has a higher boiling point than the second solvent.

In another preferred embodiment the first (or majority) solvent is selected such that it has a lower solubility for the n-type OSC than for the p-type OSC, and the second (or minority) solvent is preferably selected such that it has a lower solubility for the p-type OSC than for the n-type OSC. In addition, the first solvent in this preferred embodiment preferably has a higher boiling point than the second solvent.

In another preferred embodiment a single solvent is used having a boiling point from 80 to 280° C., preferably from 160° C. to 240° C.

In the OE device manufacturing process, the formulation is deposited on a substrate and the solvent(s) are removed from the deposited layer, for example by evaporation under heat and/or reduced pressure. Before evaporation the p-type and n-type OSC components are balanced and both solubilised in the solution.

Without wishing to be bound to any specific theories it is believed that, when using a solvent blend as described above, upon evaporation of the solvents the second (minority) lower boiling solvent will be removed faster than the first (majority) higher boiling solvent. Since this first (majority) higher boiling solvent has relatively poor solubility for the p-type OSC, as the second (minority) solvent with improved solubility for the p-type OSC is removed, the p-type OSC will begin to phase separate from the solution. The n-type OSC is unaffected due to its greater solubility in the first higher boiling solvent, and therefore remains solubilised, until sufficient quantities of the first solvent have been removed. This process results in the initiation of a phase separated network by the p-type OSC component, before the first solvent has been completely removed. The BHJ morphology is then optimized through the slower evaporation of the first solvent. Therefore manipulation of the boiling points, solubilities and ratios of the two solvents can influence the morphology/crystallinity of the heterojunction.

The selection of suitable first and second solvents according to their relative solubility for the p-type and n-type OSC can be achieved for example through the use of known solubility parameters like the Hansen Solubility Parameters (HSP). The value of the Hansen parameters for a given solvent can be found in handbooks like "Hansen Solubility Parameters: A User's Handbook", Second Edition, C. M. Hansen (2007), Taylor and Francis Group, LLC (HSPiP manual). These are usually given as $H_D$ (or simply "D"), $H_P$ (or simply "P"), and $H_H$ (or simply "H"), wherein
$H_D$ means the dispersion contribution [$MPa^{0.5}$],
$H_P$ means the polar contribution [$MPa^{0.5}$], and
$H_H$ means the Hydrogen bonding contribution [$MPa^{0.5}$].

The Hansen Solubility Parameters can be determined according to the Hansen Solubility Parameters in Practice (HSPiP) program ($2^{nd}$ edition) as supplied by Hanson and Abbot et al.

Two examples of how the HSPiP program can be used, to find solvents with Hansen parameters which will dissolve both the n-type and the p-type OSC are described.

The first is to identify solvents which have similar Hansen solubility parameters to well-dissolving cholorined solvents like chlorobenzene, chloroform and dichlorobenzene. A solvent with similar parameters is also likely to be a good solvent for the n-type or p-type OSC material. This method is of limited scope as by their nature the parameters of chlorinated species are different to that of non-chlorinated, and therefore although a match may be close this does not necessarily mean that the specific solubility will be shown.

The second is using known or experimentally derived solubility data to find groups of solvents which exhibit solubility for each component of the polymer/fullerene blend.

For fullerenes like $C_{60}$PCBM being used as n-type material, solubility data in various solvents have been reported in the literature (see Nilsson, S.; Bernasik, A.; Budkowski, A.; Moons, E. *Macromolecules* 2007, 40, 8291 and "Organic Photovoltaics: Materials, Device Physics, and Manufacturing Technologies", C. Brabec (editor), U. Scherf (Editor), V. Dyakonov (editor), Wiley, 2008).

For the p-type OSC, and alternatively for other, less characterized n-type materials, experimental work can be carried out through quantification of the solubility of each component in a variety of solvents with varying Hansen solubility parameters. For each set of solvents and conditions (concentration, temperature, time) the solubility of the component is assessed (soluble, partially soluble, insoluble for example). Using the HSPIP program the parameters of all solvents assessed can be plotted in Hanson 3D space and those showing good to partial solubility highlighted.

These highlighted points can be described effectively by the generation of a solubility "sphere" in which the distance (radius) to the centre of the sphere (where the calculated ideal Hansen parameters lie) can be defined as a measure of the solubility of a specific material. The closer the solvents solubility parameters are, the smaller the radius to the centre of the sphere and therefore the more soluble the compound in the solvent.

From the Hansen parameters obtained it is then possible to assess the solubility of the given material in any solvent, by determination of how close the Hansen parameters of the solvent are to centre of the calculated solubility sphere.

This method allows to quickly screen a large number of solvents which are suitable for dissolution of both donor and acceptor components. Additionally, assessing the solubility of each material individually, but then combining the solubility spheres, enables identification of solvents which dissolve one material better than another, and therefore provides a tool to explore selective solubility effects in the formation of BHJ morphology.

For the n-type OSC, the Hansen Solubility Parameters (the centre of the sphere) are preferably in the ranges D=16 to 22 MPa$^{0.5}$, P=0 to 11.5 MPa$^{0.5}$, H=0 to 12 MPa$^{0.5}$.

For the p-type OSC, the Hansen Solubility Parameters are preferably in the ranges D=17 to 21 MPa$^{0.5}$, P=0 to 6.5 MPa$^{0.5}$, H=0 to 6 MPa$^{0.5}$.

The solubility of the n-type OSC in the first solvent is preferably at least 0.5 mg/ml.

The solubility of the p-type OSC in the second solvent is preferably at least 0.5 mg/ml.

The concentration of the n-type OSC in the formulation is preferably from 0.1 mg/ml to 100 mg/ml, very preferably from 2 mg/ml to 40 mg/ml.

The concentration of the p-type OSC in the formulation is preferably from 0.1 mg/ml to 100 mg/ml, very preferably from 2 mg/ml to 40 mg/ml.

The first solvent is preferably selected from high boiling solvents, preferably having a boiling point ≥150° C., very preferably ≥200° C., most preferably ≥230° C.

Preferably the first solvent is selected from alkylated tetralin, alkylated naphthalene or alkylated anisole, preferably tetralin that is substituted by two or more alkyl groups, naphthalene that is substituted by one or more alkyl groups or anisole that is substituted by two or more alkyl groups, the alkyl groups preferably being straight-chain or branched alkyl with 1 to 6, very preferably 1, 2 or 3, C atoms. Very preferably the first solvent is selected form the group consisting of 1,5-dimethyltetralin, 1-methylnaphthalene, 1-ethylnaphthalene, 2-ethylnaphthalene, 1,2-dimethylnaphthalene, 1,3-dimethylnaphthalene, 1,4-dimethylnaphthalene, 2,6-dimethylnaphthalene, 2,7-diisopropylnaphthalene and dimethylanisole, most preferably 1,5-dimethyltetralin, 1-methylnaphthalene and dimethylanisole, especially 2,4-dimethylanisole.

The term "dimethylanisole" as used above and below includes any of 2,3-dimethylanisole, 2,4-dimethylanisole, 2,5-dimethylanisole, 2,6-dimethylanisole, 3,4-dimethylanisole and 3,5-dimethylanisole, and preferably means 2,4-dimethylanisole.

The second solvent is preferably selected from the group consisting of alkylated benzene, alkoxylated benzene, indane, alkylated indane, alkoxylated indane, tetralin, alkylated tetralin, naphthalene, alkylated naphthalene, anisole, alkylated anisole, and linear or cyclic ketone, wherein "alkylated" means substituted by one or more, preferably two or more straight-chain or branched alkyl groups with 1 to 6, preferably 1, 2 or 3, C atoms and "alkoxylated" means substituted by one or more, preferably two or more straight-chain or branched alkoxyl groups with 1 to 6, preferably 1, 2 or 3, C atoms.

Further preferred types of second solvents include those selected from the group consisting of aromatic and/or aliphatic ethers, aromatic alcohols, optionally substituted thiophenes, benzothiophenes, alkoxylated naphthalene, substituted benzothiazoles, alkyl benzoates, aryl benzoates.

Very preferably the second solvent is selected from the group consisting of xylene (including o-, m- and p-dimethyl benzene either as pure isomers or as isomer mixture), cymene (including o-, m- and p-methyl isopropyl benzene either as pure isomers or as isomer mixture) indane, anisole (methoxybenzene) and veratrol (o-dimethoxybenzene), dimethylanisole, tetralin, 1,5-dimethyltetralin, naphthalene, 1-methylnaphthalene, 1-ethylnaphthalene, 2-ethylnaphthalene, 1,2-dimethylnaphthalene, 1,3-dimethylnaphthalene, 1,4-dimethylnaphthalene, 2,6-dimethylnaphthalene, 2,7-diisopropylnaphthalene, cyclopentanone, cyclohexanone, most preferably from m-xylene, p-cymene, veratrol, 1,5-dimethyltetralin, 1-methylnaphthalene and indane.

Further preferred specific second solvents include those selected from the group consisting of 1,2-dihydronapthalene, decalin, diphenyl ether, cyclohexyl benzene, methyl phenyl acetate, phenyl acetate, benzyl acetate, ethyl benzoate, gamma-terpinene, benzothiophene, thiophene, 1-methoxynaphthalene, benzyl alcohol, cyclohexanol, indene, 1,4-dioxane, ethylene glycol monobutyl ether, diethyl ether, N-methylpyrrolidone, diethyl phthalate, benzyl benzoate, ethyl benzoate, acetophenone, propiophenone, 2-heptanone, cyclohexanone, benzothiazole, benzonitrile, bicyclohexyl, methyl isobutyl ketone.

The second solvent is preferably selected to have a lower boiling point than the first solvent, and preferably has a boiling point ≥100° C., very preferably ≥130° C., most preferably ≥160° C.

If a single solvent is used, it is preferably selected from alkylated tetralin, alkylated naphthalene or alkylated anisole, preferably tetralin that is substituted by two or more alkyl groups, naphthalene that is substituted by one or more alkyl groups, or anisole th that is substituted by one or more alkyl groups, wherein the alkyl groups are preferably straight-chain or branched alkyl with 1 to 6, very preferably 1, 2 or 3 C atoms. Very preferably the single solvent is selected from the group consisting of 1,5-dimethyltetralin, 1-methylnaphthalene, 1-ethylnaphthalene, 2-ethylnaphthalene, 1,2-dimethylnaphthalene, 1,3-dimethylnaphthalene, 1,4-dimethylnaphthalene, 2,6-dimethylnaphthalene, 2,7-diisopropylnaphthalene and dimethyl anisole, most preferably 1,5-dimethyltetralin, 1-methylnaphthalene and 2,4-dimethylanisole.

Preferably in the solvent blend the ratio of the first solvent is higher than the ratio of the second solvent. In case more than one first and/or more than one second solvent are present, preferably in the solvent blend the total ratio of all first solvents in the blend is higher than the total ratio of all second solvents.

The amount of the first solvent in the solvent blend is preferably ≥50 vol. %. The amount of the second solvent in the solvent blend is preferably ≥5 vol. %

Very preferably the ratio (vol. %) of the first and the second solvent, or the total ratio of all first and all second solvents, is in the range from 50:50 to 5:95.

The p-type OSC can be selected from standard materials that are known to the person skilled in the art and are described in the literature, including organic polymers and small molecules.

In a preferred embodiment the p-type OSC comprises an organic conjugated polymer, which can be a homopolymer or copolymer, and in case of copolymers can be an alternating copolymer (e.g. of the ABAB or ABCABC type), statistical (random) copolymer or a block copolymer.

Preferably the p-type organic semiconductor is a non-crystalline or semi-crystalline conjugated organic polymer.

Further preferably the p-type organic semiconductor is a conjugated organic polymer with a low bandgap, typically between 2.1 eV and 1.1 eV, preferably between 1.9 eV and 1.1 eV, and most preferably between 1.7 eV and 1.1 eV.

Preferred p-type OSC polymers are selected from conjugated hydrocarbon or heterocyclic polymers including but not limited to the group consisting of polyacene, polyphenylene, poly(phenylene vinylene), polyfluorene, polyindenofluorene, poly(3-substituted thiophene), poly(3,4-bisubstituted thiophene), polyselenophene, poly(3-substituted selenophene), poly(3,4-bisubstituted selenophene), poly(bisthiophene), poly(terthiophene), poly(bisselenophene), poly(terselenophene), polythieno[2,3-b]thiophene, polythieno[3,2-b]thiophene, polybenzothiophene, polybenzo[1,2-b:4,5-b']dithiophene, polyisothianaphthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene, polypyrazoline, polybenzofuran, polyindole, polypyridazine, polytriarylamine, including any co-polymers of the aforementioned, and wherein all these polymers are optionally substituted by one or more groups R, wherein R is halogen, CN or a carbyl or hydrocarbyl group, preferably F, CN, alkyl, alkoxy, thiaalkyl, carbonylalkyl, oxacarbonylalkyl, carbonyloxaalkyl, each of which is straight-chain or branched, is optionally fluorinated and preferably has from 1 to 30 C-atoms, or phenyl that is substituted with one or more F atoms and/or with one or more optionally fluorinated alkyl or alkoxy groups having 1 to 20 C atoms.

Further preferred p-type OSCs are co-polymers comprising one or more distinct electron acceptor units and one or more distinct electron donor units. Preferred co-polymers of this type comprise one or more units selected from Group D and Group A as defined below, and preferably comprise one or more units of Group D and one or more units of Group A, wherein Group D consists of arylene and heteroarylene groups, preferably having electron donor properties, selected from the group consisting of the following formulae

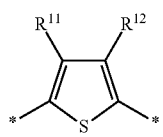 (D1)

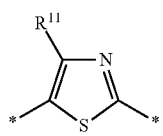 (D2)

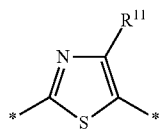 (D3)

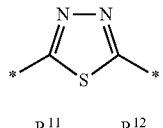 (D4)

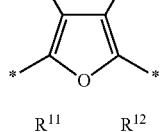 (D5)

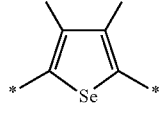 (D6)

-continued

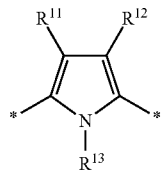 (D7)

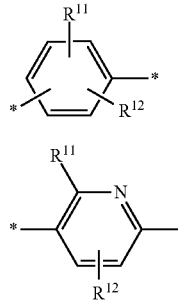 (D8)

(D9)

(D10)

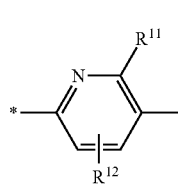 (D11)

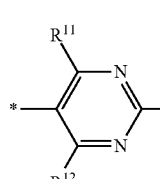 (D12)

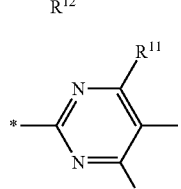 (D13)

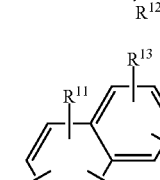 (D14)

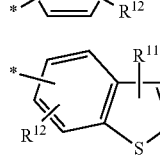 (D15)

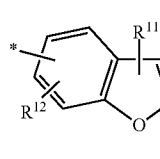 (D16)

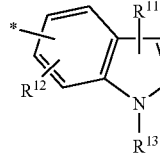

-continued
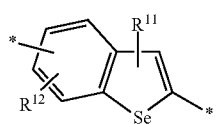 (D17)
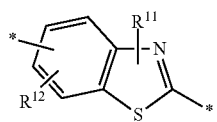 (D18)
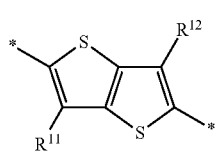 (D19)
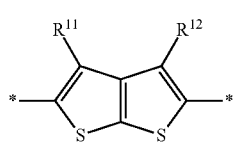 (D20)
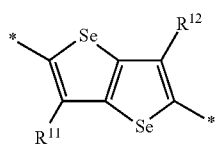 (D21)
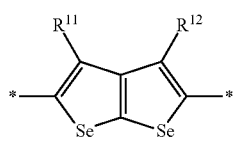 (D22)
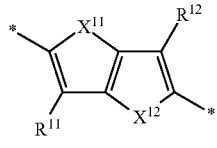 (D23)
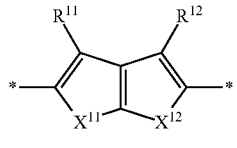 (D24)
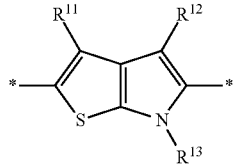 (D25)
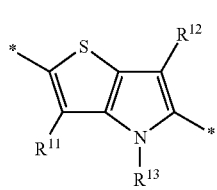 (D26)
-continued
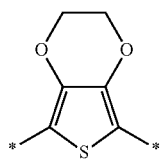 (D27)
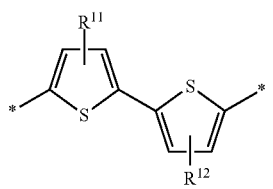 (D28)
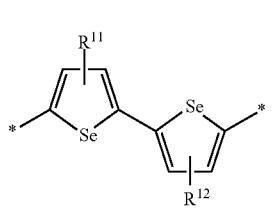 (D29)
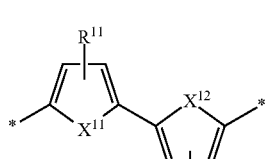 (D30)
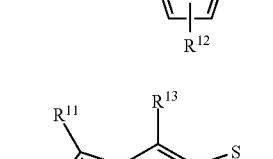 (D31)
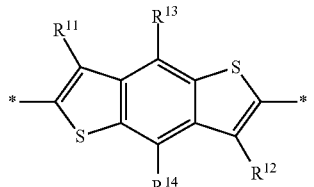 (D32)
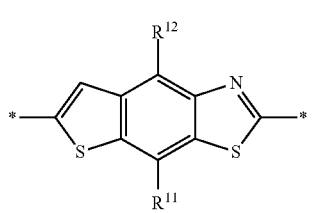 (D33)
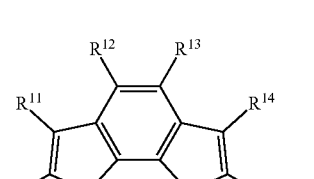 (D34)

(D35)
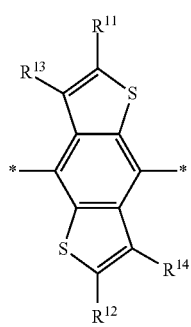
(D36)
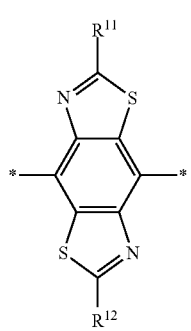
(D37)
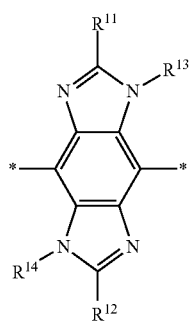
(D38)
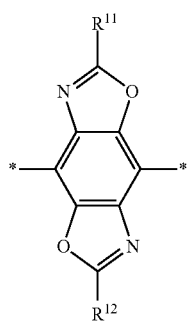
(D39)
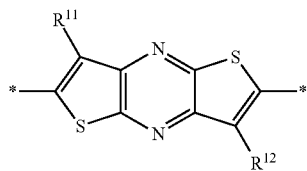
(D40)
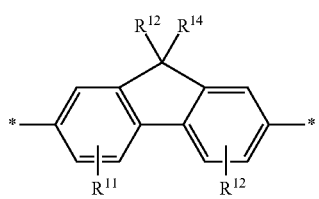
(D41)
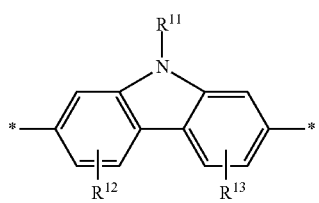
(D42)
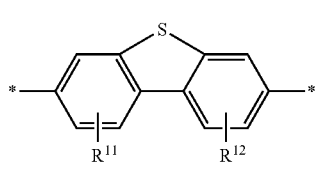
(D43)
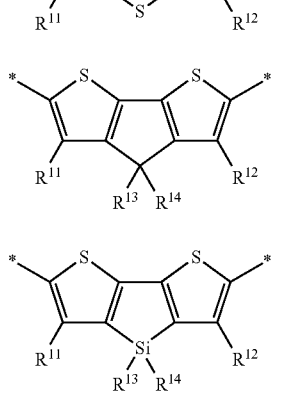
(D44)
(D45)
(D46)
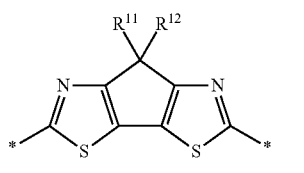
(D47)
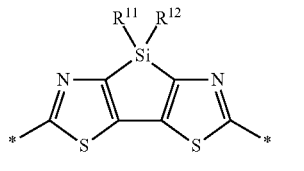
(D48)

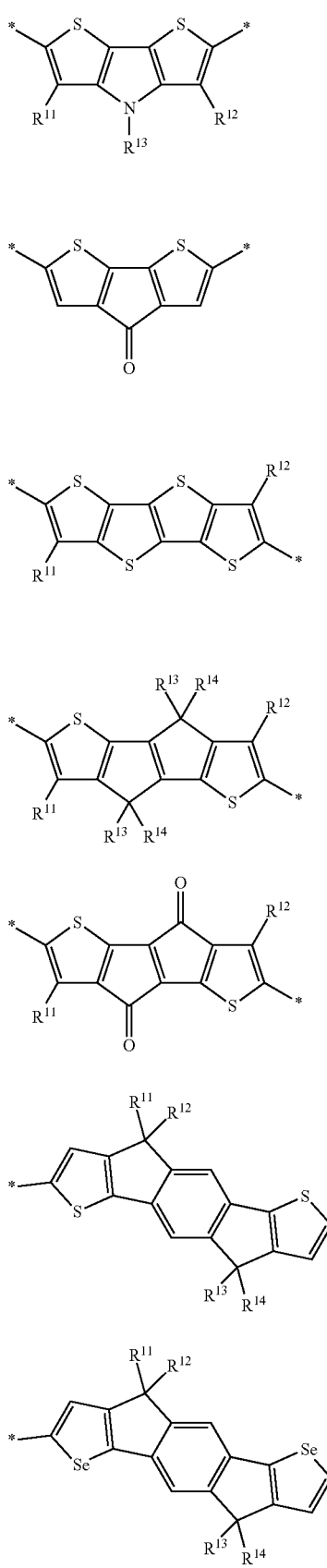
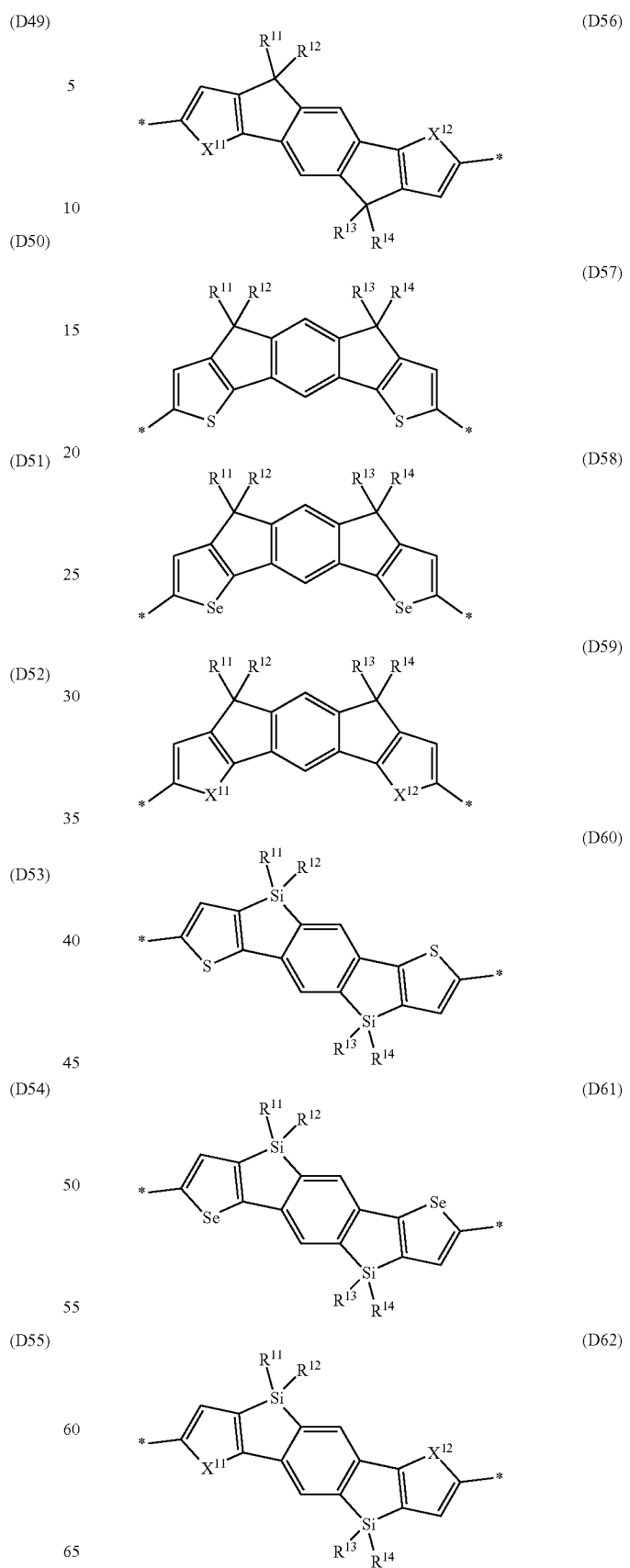

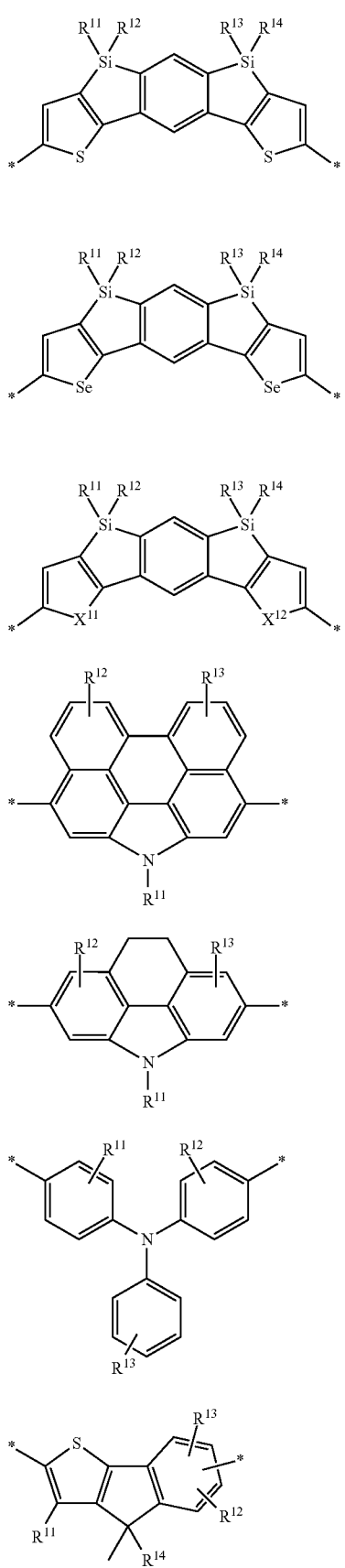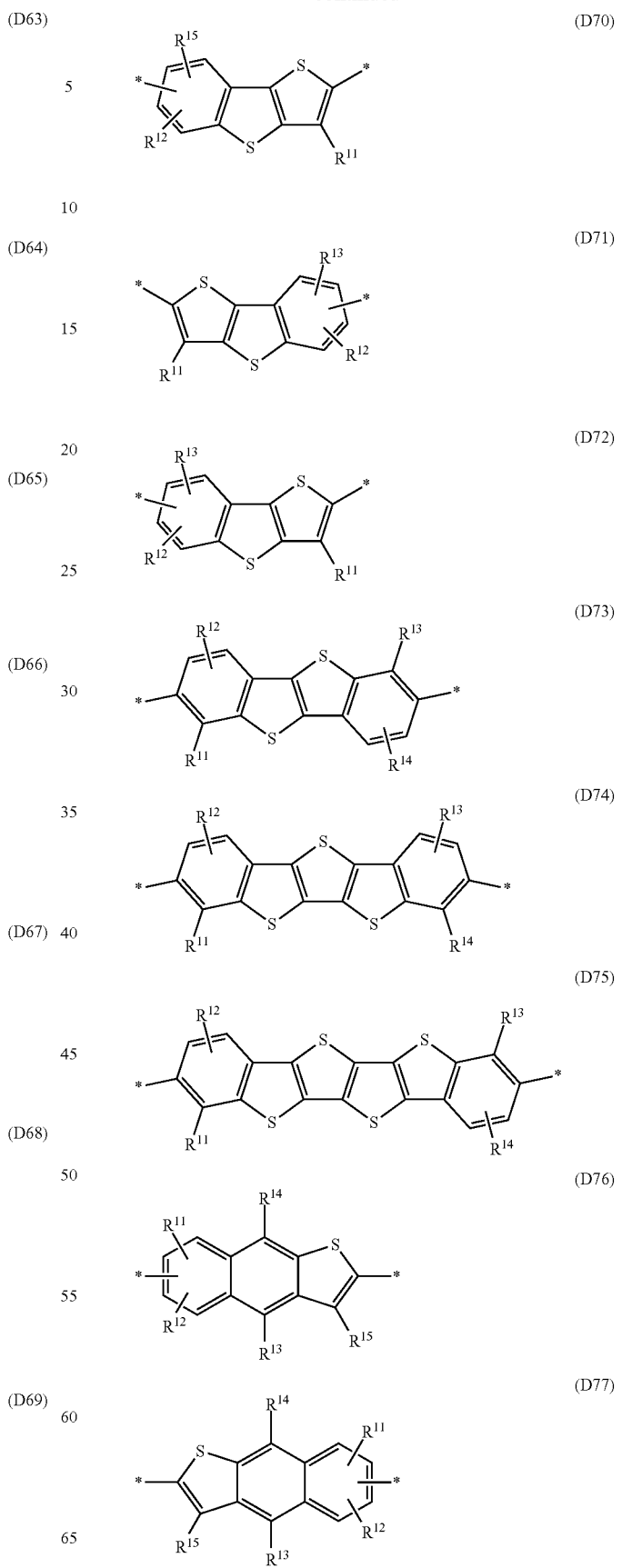

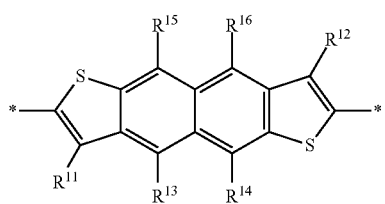
(D78)
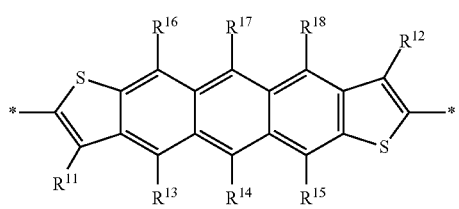
(D79)
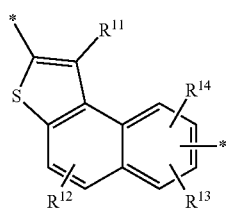
(D80)
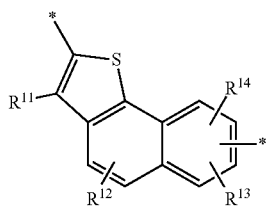
(D81)
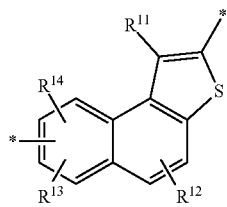
(D82)
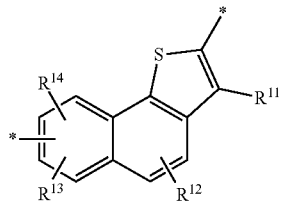
(D83)
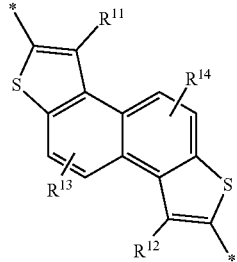
(D84)
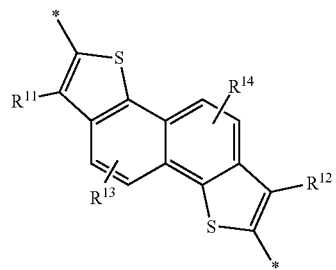
(D85)
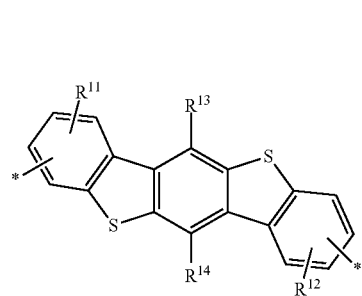
(D86)
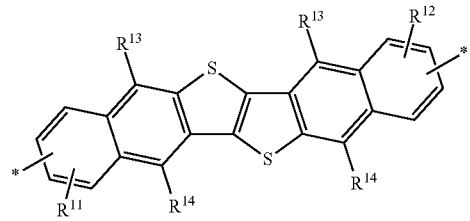
(D87)
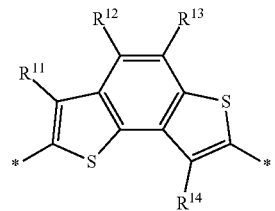
(D88)
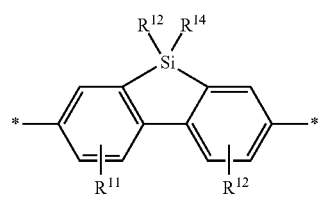
(D89)
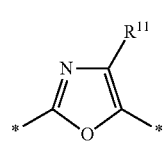
(D90)
(D91)

-continued
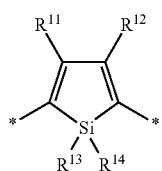
(D92)
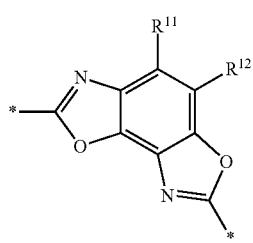
(D93)
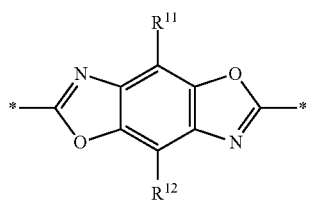
(D94)
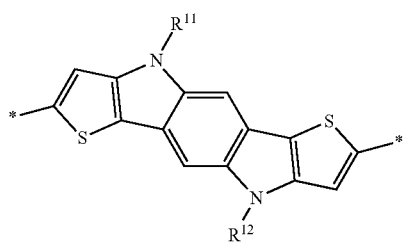
(D95)
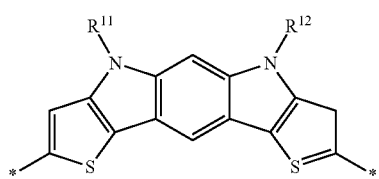
(D96)
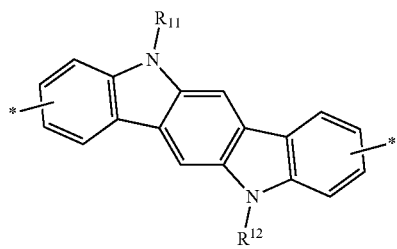
(D97)
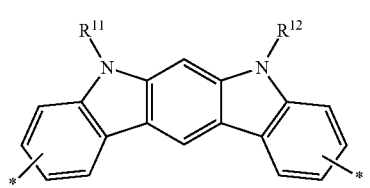
(D98)
-continued
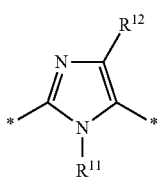
(D99)
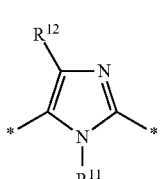
(D100)
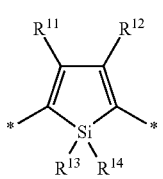
(D101)
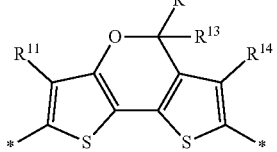
(D102)
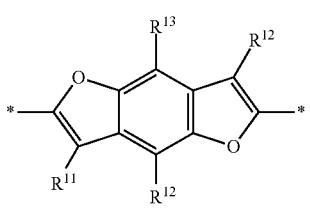
(D103)
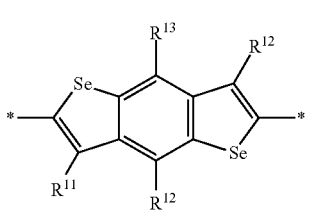
(D104)
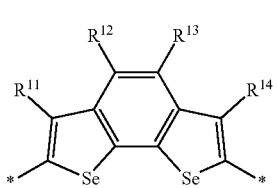
(D105)
(D106)

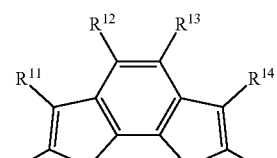 (D107)
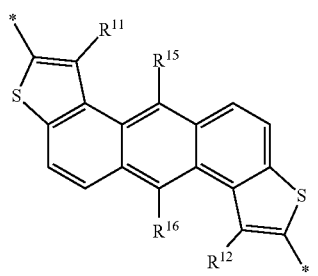 (D108)
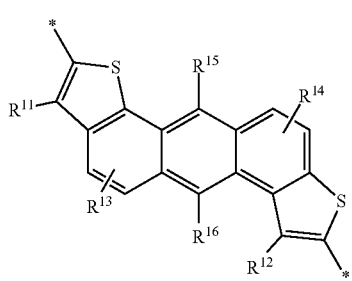 (D109)
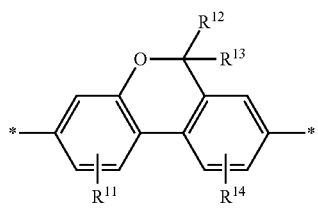 (D110)
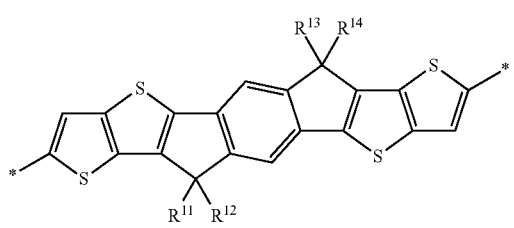 (D111)
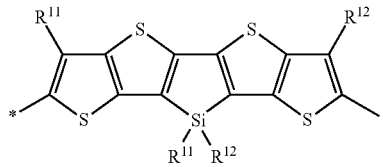 (D112)
and Group A consists of arylene or heteroarylene groups, preferably having electron acceptor properties, selected from the group consisting of the following formulae
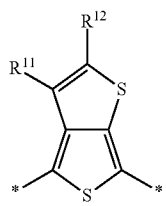 (A1)
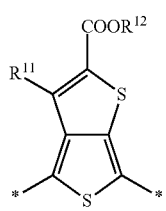 (A2)
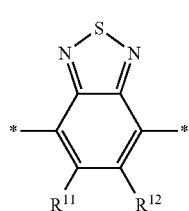 (A3)
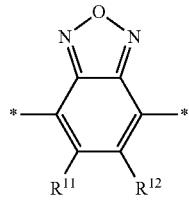 (A4)
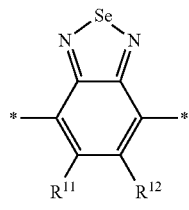 (A5)
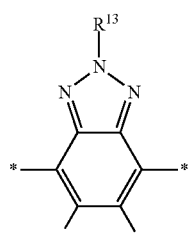 (A6)
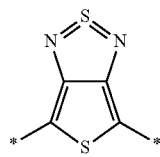 (A7)

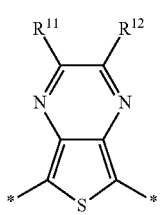 (A8)
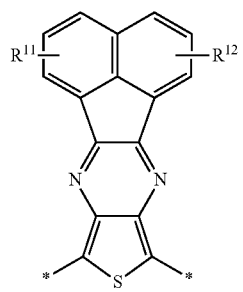 (A9)
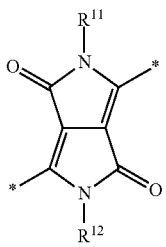 (A10)
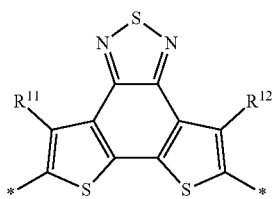 (A11)
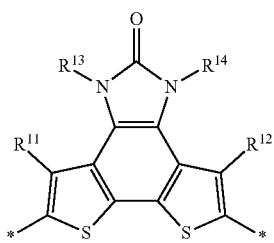 (A12)
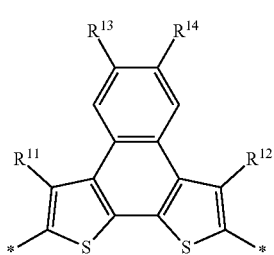 (A13)
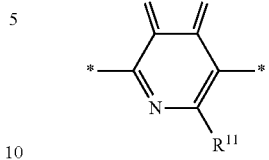 (A14)
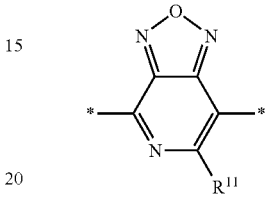 (A15)
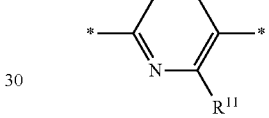 (A16)
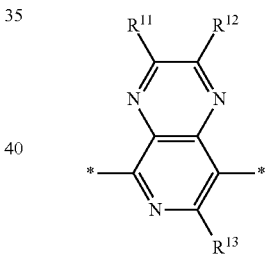 (A17)
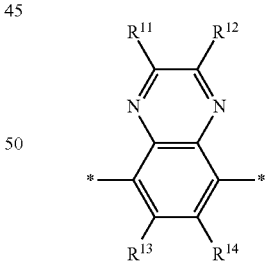 (A18)
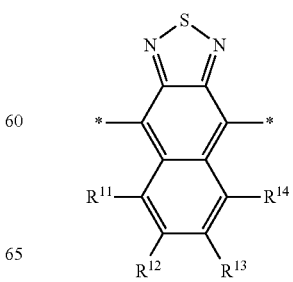 (A19)

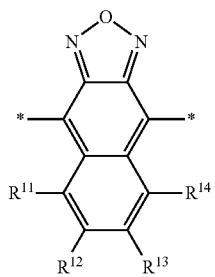 (A20)
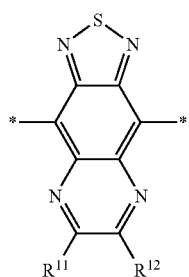 (A21)
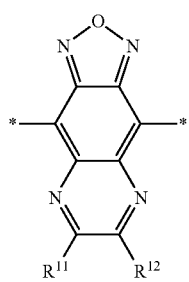 (A22)
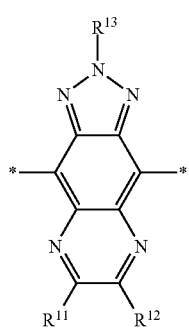 (A23)
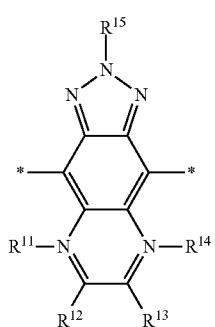 (A24)
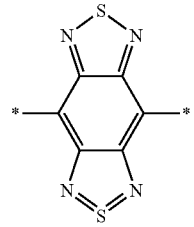 (A25)
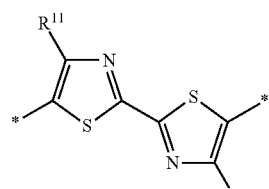 (A26)
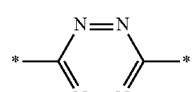 (A27)
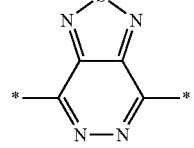 (A28)
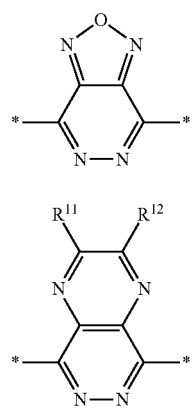 (A29)
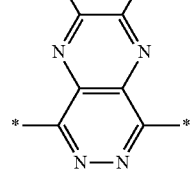 (A30)
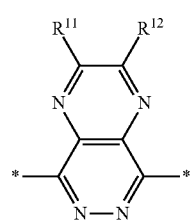 (A31)
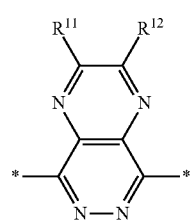 (A32)

-continued
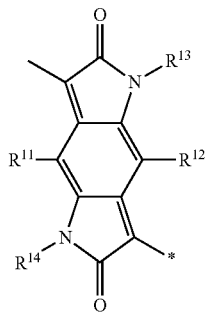
(A33)
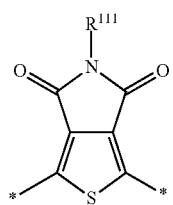
(A34)
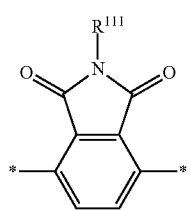
(A35)
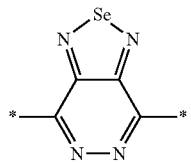
(A36)
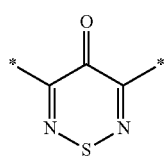
(A37)
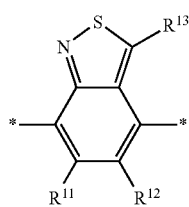
(A38)
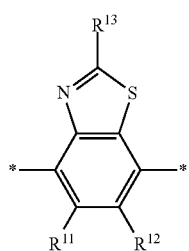
(A39)
-continued
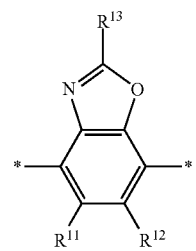
(A40)
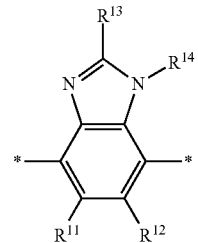
(A41)
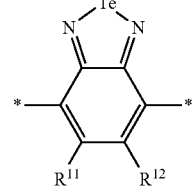
(A42)
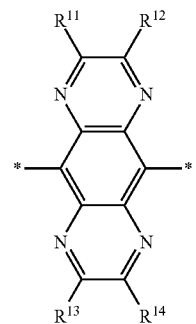
(A43)
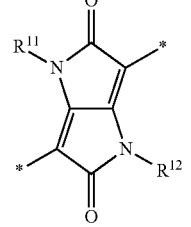
(A44)
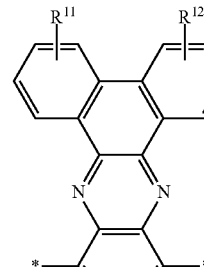
(A45)

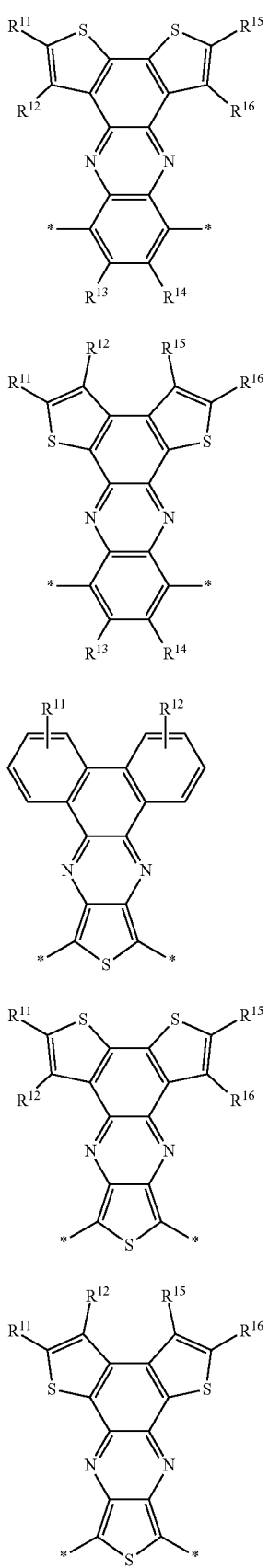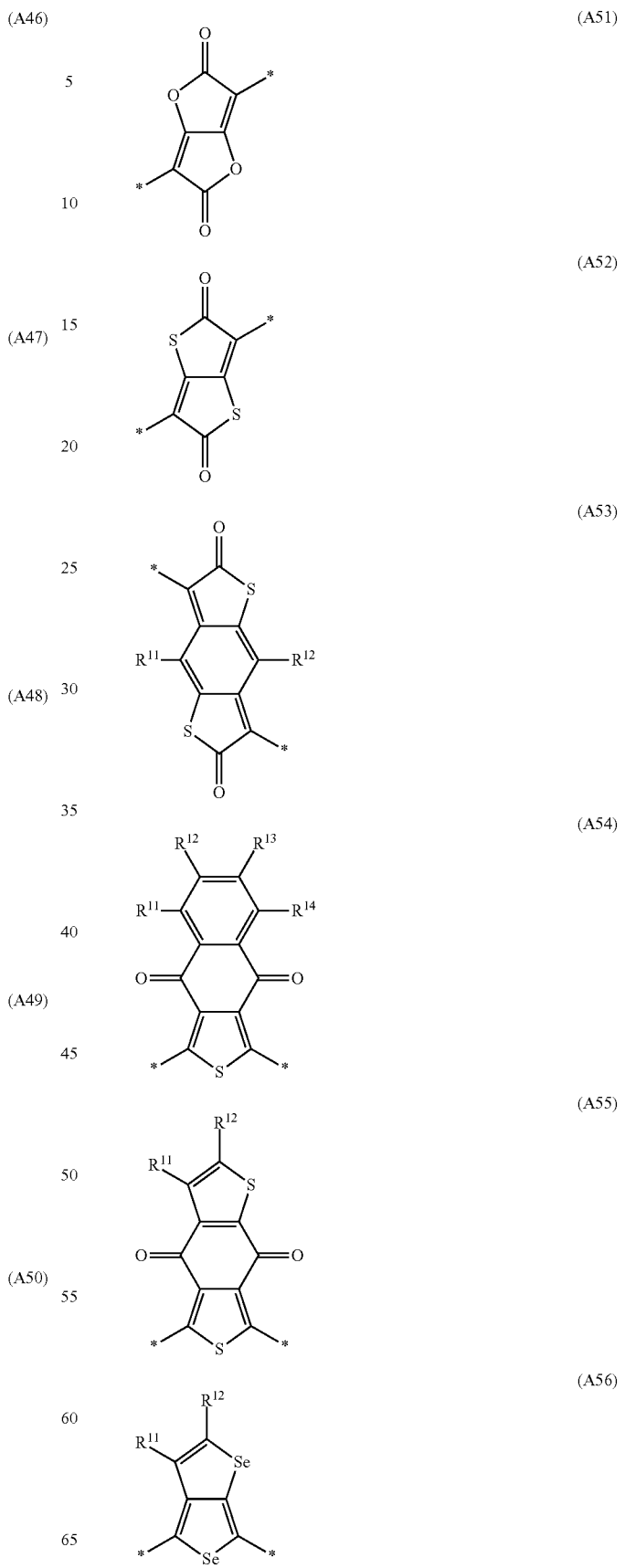

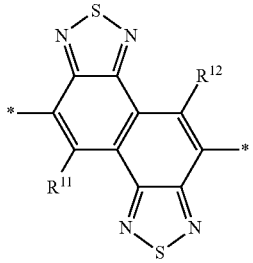
(A57)

including any co-polymers of the aforementioned, wherein one of $X^{11}$ and $X^{12}$ is S and the other is Se, and $R^{11}$, $R^{12}$, $R^{13}$, $R^{14}$, $R^{15}$, $R^{16}$, $R^{17}$ and $R^{18}$ independently of each other denote H or R as defined above.

Further preferred co-polymers of this type comprise one or more units selected from formulae D1-D112 and A1-A57 as described above, and preferably comprise one or more units selected from the group consisting of formulae D1, D2, D3, D4, D5, D6, D7, D19, D21, D23, D28, D29, D30 and D31, very preferably of formulae D1, D2, D3, D5, D19, D28 and D31, and further comprise one or more units selected from the group consisting of formulae A1, A2, A3, A4, A5, A34 and A44, very preferably of formulae A2 and A3.

Further preferred co-polymers comprise one or more benzo[1,2-b:4,5-b']di-thiophene-2,5-diyl (BDT) units that are preferably 3,7-disubstituted and/or 4,8-disubstituted with R as defined above, and further comprise one or more units selected from Group D and Group A. Preferably these co-polymers comprise, in addition to the BDT units, at least one unit of Group D, preferably of formula D1, and at least one unit of Group A, preferably of formula A3.

Especially preferred are co-polymers of the following formulae

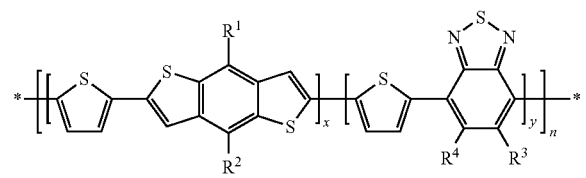
P1

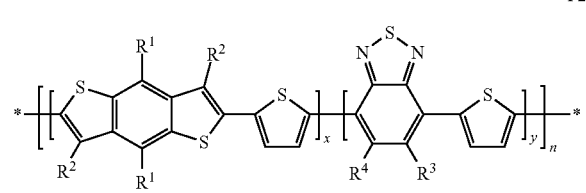
P2 wherein
$R^{1-4}$ have independently of each other one of the meanings of R as given above,
x is >0 and ≤1,
y is ≥0 and <1,
x+y is 1, and
n is an integer >1.

$R^1$ and $R^2$ preferably denote alkyl, oxaalkoxy, thiaalkyl, carbonylalkyl, oxacarbonylalkyl or carbonyloxaalkyl, which is straight-chain or branched, is optionally fluorinated and has 1 to 20 C atoms.

$R^3$ and $R^4$ preferably denote alkyl or alkoxy which is straight-chain or branched, is optionally fluorinated and has 1 to 20 C atoms.

The n-type OSC is preferably a fullerene or a fullerene derivative or a polymer comprising one or more fullerene or substituted fullerene groups.

Preferred fullerene and fullerene derivatives are those of formula F1

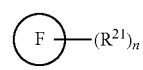
F1 wherein F is a fullerene radical of the formula $C_{(20+2m)}$ or $C_{(20+2m+1)}$, wherein m is 20 or an integer from 25 to 40, preferably 20, 25, 28, 29 or an integer from 30 to 38, $R^{21}$ is a carbyl or hydrocarbyl group that is bonded to one or two C-atoms of the fullerene radical, and n is 0 or an integer from 1 to 20+2m.

Very preferred fullerene derivatives are those of formula F2 (methanofullerenes):

F2 wherein
F is as defined above,
n is an integer from 1 to 10+m, preferably 1 or 2,
$R^{22}$ and $R^{23}$ denote independently of each other straight-chain, branched or cyclic alkyl having from 1 to 30 C-atoms, wherein one or more non-adjacent $CH_2$ groups to be replaced, in each case independently from one another, by —O—, —S—, —NR°—, —C(O)—, —CH=CH— or —C≡C— in such a manner that O and/or S atoms are not linked directly to one another, or denote aryl or heteroaryl, arylalkyl or heteroarylalkyl with 2 to 40 C-atoms, all of which are optionally substituted with one or more groups L,
L is selected from halogen, —CN, —NO_2, —OH, —SH, —SO_3H, —SO_2R°, —CF_3, —SF_5, —C(O)R°, —OC(O)R°, —C(O)OR°, —C(O)NR°R°°, —NR°—C(O)R°°— NR°R°°, alkyl, alkoxy, oxaalkyl, thioalkyl, fluoroalkyl and fluoroalkoxy with 1 to 12 C atoms or alkenyl, alkynyl with 2 to 12 C atoms,
R° and R°° are independently of each other H, alkyl or aryl, preferably H, alkyl with 1 to 10 C atoms or phenyl.

Especially preferred is a (6,6)-phenyl-butyric acid methyl ester derivatized methano $C_{60}$ fullerene, also known as "PCBM" or "$C_{60}$PCBM", having the structure shown below, or an structural analogous compound with a higher fullerene like for example a $C_{61}$, a $C_{70}$ or a $C_{71}$ fullerene group ($C_{61}$PCBM, $C_{70}$PCBM, $C_{71}$PCBM).

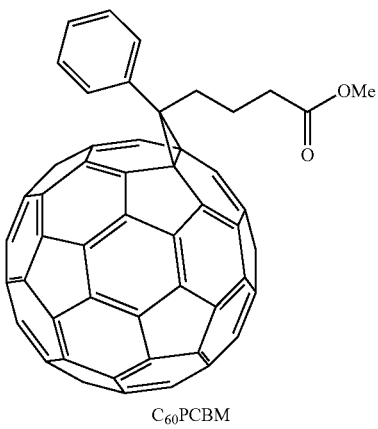

C<sub>60</sub>PCBM

Suitable synthesis methods for the fullerenes shown above, and further examples of suitable and preferred fullerenes, are disclosed in U.S. Pat. No. 5,739,376, WO 2004/073082 A1 and WO 2008/006071 A1.

In another preferred embodiment the formulation additionally comprises one or more further components selected from surface-active compounds, lubricating agents, wetting agents, dispersing agents, hydrophobing agents, adhesive agents, flow improvers, defoaming agents, deaerators, viscosity enhancers, diluents which may be reactive or non-reactive, auxiliaries, colourants, dyes or pigments, sensitizers, stabilizers, nanoparticles and inhibitors.

The formulation according to the present invention can be applied onto a substrate or a component of the OE device by any suitable solution deposition method, including but not limited to coating or printing or microdispensing methods like for example dip coating, spin coating, slot-die printing, ink jet printing, letter-press printing, screen printing, doctor blade coating, roller printing, reverse-roller printing, offset lithography printing, flexographic printing, web printing, spray coating, brush coating or pad printing. Especially preferred are spin coating, blade coating, slot-die printing, flexographic printing, gravure printing, ink jet printing, micro-contact printing, soft lithography or stamping.

For example, the formulations of the present invention can be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used. Additionally semi-industrial heads such as those manufactured by Brother, Epson, Konica, Seiko Instruments Toshiba TEC or single nozzle microdispensers such as those produced by Microdrop and Microfab may be used.

The size of the printed features can range from lines or dots of about 1 micron diameter or even less, respectively, to large areas in the range of several $m^2$, preferably from 10 microns to 1 $m^2$.

Removal of the solvent(s) is preferably achieved by evaporation, for example by exposing the deposited layer to high temperature and/or reduced pressure.

The thickness of the OSC layer after removal of solvent is preferably from 10 nm to 5 micron, more preferably from 20 nm to 2 micron, even more preferably from 50 nm to 1 micron, most preferably from 200 nm to 500 nm.

The invention further relates to a process of preparing an OE device comprising the following steps a) providing an anode,
b) providing a cathode,
c) depositing a formulation as described above and below between the anode and the cathode, and removing any solvents present in the formulation,
wherein one of steps a) and b) may also be carried out after step c).

The invention further relates to an OE device comprising an anode,
a cathode,
an active layer formed from a formulation as described above and below or formed by step c) of the process as described above and below.

The OE device is preferably an OPV device or an inverted OPV device, an organic solar cell or a photodiode, very preferably a BHJ OPV device or an inverted BHJ OPV device.

Figure 2:
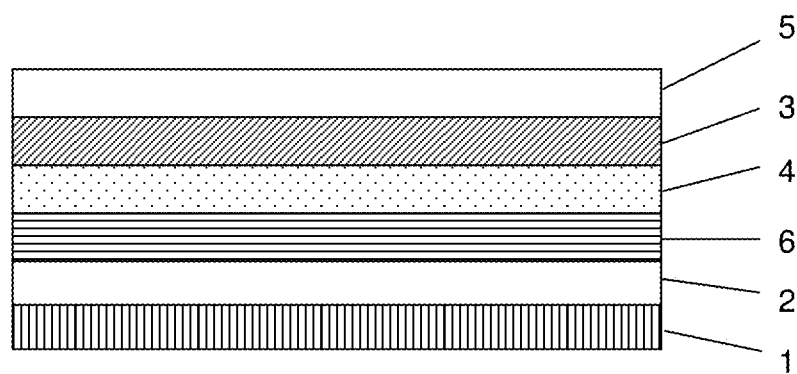
FIG. 2 exemplarily and schematically depicts the structure of an inverted OPV device according to the present invention.

The OPV device can be of any type known from the literature (see for example Waldauf et al., Appl. Phys. Lett., 2006, 89, 233517, or Coakley, K. M. and McGehee, M. D. Chem. Mater. 2004, 16, 4533). FIG. 1 and FIG. 2 exemplarily and schematically depict a typical and preferred OPV device and inverted OPV device, respectively, according to the present invention.

A first preferred OPV device according to the invention, as exemplarily illustrated in FIG. 1, comprises the following layers (in the sequence from bottom to top):
  a substrate transparent to visible light (1),
  a high work function electrode (2), for example of indium tin oxide (ITO), serving as anode,
  optionally a conducting layer or a hole transport layer (HTL) or a electron blocking layer (EBL) (3), preferably comprising an organic polymer or polymer blend, like for example a blend of PEDOT:PSS (poly(3,4-ethylenedioxythiophene):poly(styrene-sulfonate)),
  a layer (4), also referred to as the "active layer", comprising a p-type OSC and an n-type OSC, which is for example a bilayer formed by p-type and n-type sublayers, or comprises two distinct p-type and n-type layers, respectively, or is a phase-separated blend or mixture of p-type and n-type OSC, forming a bulk heterjunction (BHJ),
  optionally a conducting layer or a electron transport layer (ETL) or a hole blocking layer (HBL) (6), preferably comprising a an organic polymer or polymer blend, metal oxide or metal halogenide, like for example LiF, Ca,
  a low work function electrode (5), for example comprising a low work function metal like aluminium, serving as cathode,
  wherein at least one of the electrodes (2) and (5) and associated ETL's, HTL's, EBL's or HBL's, most preferably the anode (2) the HTL and EBL, are transparent to visible light, and
  wherein the active layer (4) is prepared from a formulation according to the present invention.

A second preferred OPV device according to the invention is an inverted OPV device as exemplarily illustrated in FIG. 2, and comprises the following layers (in the sequence from bottom to top):
  a substrate transparent to visible light (1),
  a high work function electrode (2), for example of indium tin oxide (ITO), serving as cathode,
  a conductive layer, electron transport layer (ETL) or hole blocking layer (HBL) (6), preferably comprising an organic polymer or polymer blend or a metal or metal oxide like for example $TiO_x$ or $ZnO_x$, a layer (4), also referred to as "active layer", comprising a p-type OSC and an n-type OSC, which is for example a bilayer formed by p-type and n-type sublayers, or comprises two distinct p-type and n-type layers, respectively, or is a phase-separated blend or mixture of p-type and n-type OSC, forming a bulk heterjunction (BHJ), optionally a conducting layer or a hole transport layer (HTL) or a electron blocking layer (EBL) (3), preferably comprising an organic polymer or polymer blend, like for example a blend of PEDOT:PSS, a high work function electrode (5), for example comprising a high work function metal like gold, serving as anode, wherein at least one of the electrodes (2) and (5) and associated ETL's, HTL's, EBL's or HBL's, most preferably the cathode (2) the HBL and ETL are transparent to visible light, and wherein the active layer (4) is prepared from a formulation according to of the present invention.

For manufacturing an OPV device as illustrated in FIG. 1, preferably first the anode (2) is provided on the substrate (1), optionally the hole conducting polymer layer or electron blocking layer (3) is provided on top of the anode and the active layer (4) is prepared by depositing the formulation according to the present invention on top of the conducting polymer layer (3) or the anode (2) and removing the solvent(s). Optionally the hole blocking layer or electron transporting layer (6) is then provided on the active layer (4) and the cathode (5) is provided on the conducting layer (6) or on the active layer (4).

For manufacturing an inverted OPV device as illustrated in FIG. 2, preferably first the cathode (2) is provided on the substrate (1), the electron conducting layer or hole blocking layer (6) is provided on top of the anode, and then the active layer (4) is prepared by depositing the formulation according to the present invention on top of the layer (6) or the cathode (2) and removing the solvent(s). Optionally the electron blocking layer or conducting polymer layer or hole conducting layer (3) is then provided on the active layer (4), and the anode (5) is provided on the layer (3) or on the active layer (4).

The individual process steps for manufacturing an OPV device are well-known and described in the literature.

The substrate can be any substrate suitable for the preparation of OE devices and transparent to visible light, and can be rigid or flexible. Suitable and preferred substrates are for example glass, planarised Si glass, or flexible plastic films like polyethylene terephthalate (PET), polyethylene naphthalate (PEN), or polyimide films.

The anode comprises preferably a high work function metal such as Au, Pt, Pd, Ir, Ni, Cu, Ag, Mo, or a conducting oxide such as ITO, AZO, or conducting nanowires, nanorods or nanotubes of for example carbon. The cathode comprises preferably a low work function metal like for example Al, Ca, Ba, Cs, Ce, Na, K.

The optional HTL or EBL or conducting layer (3) preferably comprises an organic polymer or polymer blend like PEDOT or PEDOT/PSS or another suitable conducting organic material, many of which are commercially available. The optional HBL or ETL or conducting layer (6) preferably comprises a metal, metal oxide or metal fluoride like $TiO_x$, $ZnO_x$ or LiF.

The metal or metal-containing conducting or electrode layers can be applied for example by vapor deposition. Patterned layers can be formed by evaporation through a shadow mask or by directly printing a metal precursor or paste, for example silver paste, to the desired area by any printing method know to those skilled in the art.

The organic polymer layers can be applied for example by coating or printing methods as described above. Patterned layers can be formed by printing the desired pattern. The organic polymer layers like layer (3) or (4) can be annealed after deposition and solvent removal.

The device can also be encapsulated for example by epoxy/glass or any other suitable encapsulant for protection against environmental influence.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

EXAMPLES

OPV Standard Device Fabrication

OPV devices were fabricated on ITO-glass substrates (13Ω/), purchased from LUMTEC corporation. Substrates were cleaned using common solvents (acetone, IPA, DI water) in an ultrasonic bath prior to a conventional photolithography process was carried out to define the bottom electrodes (anodes).

A conducting polymer poly-(ethylene dioxythiophene) doped with poly(styrene sulfonic acid) [Clevios VPAI 4083 (N. C. Starck)] was mixed on a 1:1 ratio with DI-water. This solution was sonicated for 20 min to ensure proper mixing and filtered using a 0.2 µm filter and then was spin coated to a thickness of 20 nm. Substrates were exposed to ozone prior to the spin-coating process to ensure good wetting properties. Films were then annealed at 130° C. for 30 min in an inert atmosphere where they were kept for the rest of the process.

Active materials solutions were prepared at the concentration and components ratio stated in the examples. Thin films were blade coated according to the reported conditions in an inert atmosphere to achieve thicknesses between 200 and 300 nm, or spin coated to achieve thicknesses between 50 and 150 nm, measured using a profilemeter. A short drying period followed to ensure removal of excess of solvent. Typically, spin coated films were dried at RT for 10 min. Blade coated films were dried at 70° C. for 3 minutes on the hotplate.

As the last step of the device fabrication, Calcium (30 nm)/Aluminium (200 nm) cathodes were thermally evaporated through a shadow mask to define cells.

Samples were measured at RT using a Solar Simulator from Newport Ltd (model 91160) as 1 Sun light source and using a calibrated Si-cell as reference. I-V data was obtained through a Keithley 2400 sourcemeter interfaced to a PC and controlled via software designed in-house. The I-V data was processed to obtain the values of $V_{oc}$, $J_{sc}$, FF and PCE for each cell. All performance values unless stated otherwise, represent averaged values collected from a minimum of 5 individual OPV cells fabricated on a single substrate. The cell area is 0.045 cm².

Examples 1 to 5

The following examples show devices of polymer P1 and PC60BM fabricated from 1,2-dichlorobenzene and a number of single non-chlorinated solvents. A summary of the performance of each example is given in Table 1.

Polymer P1

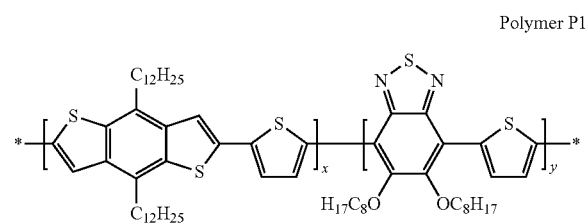

$M_n$=25900, $M_w$=53300, PDI=2.05, HOMO=−5.34 eV, LUMO=−3.58 eV, Eg=1.76 eV

Example 1—Comparison Example

A 30 mg/ml formulation in 1,2-dichlorobenzene (1,2-DCB) of polymer P1 and PC60BM (1:2 ratio by mass) was prepared in an inert atmosphere. The solution was heated overnight at 60° C., and heated to 70° C. for 1 hour prior to doctor blading. The doctor blade plate was heated to 70° C. and 40 µl of solution was coated at 40 mm/s. The film was dried at 70° C. for 2 minutes after coating.

Example 2

A 30 mg/ml formulation in 1,5-dimethyltetralin (1,5-DMT) of polymer P1 and PC60BM (1:2 ratio by mass) was prepared in an inert atmosphere. The solution was heated overnight at 60° C., and heated to 70° C. for 1 hour prior to doctor blading. The doctor blade plate was heated to 70° C. and 40 µl of solution was coated at 30 mm/s. The film was dried at 70° C. for 3 minutes after coating.

Example 3—Comparison Example

A 25 mg/ml formulation in tetralin of polymer P1 and PC60BM (1:2 ratio by mass) was prepared in an inert atmosphere. The solution was heated overnight at 60° C., and heated to 90° C. for 1 hour prior to doctor blading. The doctor blade plate was heated to 90° C. and 40 µl of solution was coated at 40 mm/s. The film was dried at 90° C. for 5 minutes after coating.

Example 4

A 25 mg/ml formulation in 1-methylnaphthalene (1-MN) of polymer P1 and PC60BM (1:2 ratio by mass) was prepared in an inert atmosphere. The solution was heated overnight at 60° C., and heated to 90° C. for 1 hour prior to doctor blading. The doctor blade plate was heated to 90° C. and 60 µl of solution was coated at 40 mm/s. The film was dried at 90° C. for 5 minutes after coating.

Example 5—Comparison Example

A 25 mg/ml formulation in m-xylene of polymer P1 and PC60BM (1:2 ratio by mass) was prepared in an inert atmosphere. The solution was heated overnight at 60° C., and heated to 90° C. for 1 hour prior to doctor blading. The doctor blade plate was heated to 90° C. and 60 µl of solution was coated at 40 mm/s. The film was dried at 90° C. for 5 minutes after coating.

TABLE 1

| Example | Solvent | Voc (V) | Jsc (mA) | FF | PCE (%) |
|---|---|---|---|---|---|
| 1 (Comp.) | 1,2-DCB | 790 | −8.6 | 61 | 4.12 |
| 2 | 1,5-DMT | 833 | −8.3 | 60 | 4.18 |
| 3 (Comp.) | Tetralin | 672 | −5.9 | 50 | 1.99 |
| 4 | 1-MN | 824 | −7.6 | 62 | 3.90 |
| 5 (Comp.) | m-Xylene | 801 | −5.2 | 65 | 2.64 |

It can be seen that the devices prepared from the formulations of Examples 2 and 4 show the highest values of $V_{oc}$ and of the efficiency, which are comparable to, or even higher than, those of the device prepared from the formulation with DCB of Comparison Example 1, whereas the devices prepared from the formulations of Comparison Examples 3 and 5 show lower values of $V_{oc}$ and of the efficiency.

Figure 3:
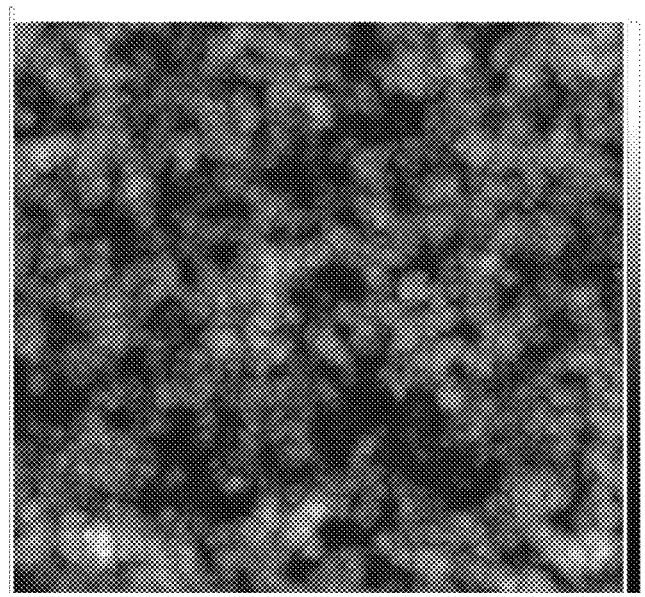
FIG. 3 shows an AFM image of a device according to Example 1.

FIG. 3 shows an AFM image of a device made as in Example 1 with 1,2-diclorobenzene as the solvent. The average RMS roughness of the OPV:PCBM blend is 1.1 nm (1 µm scan).

Figure 4:
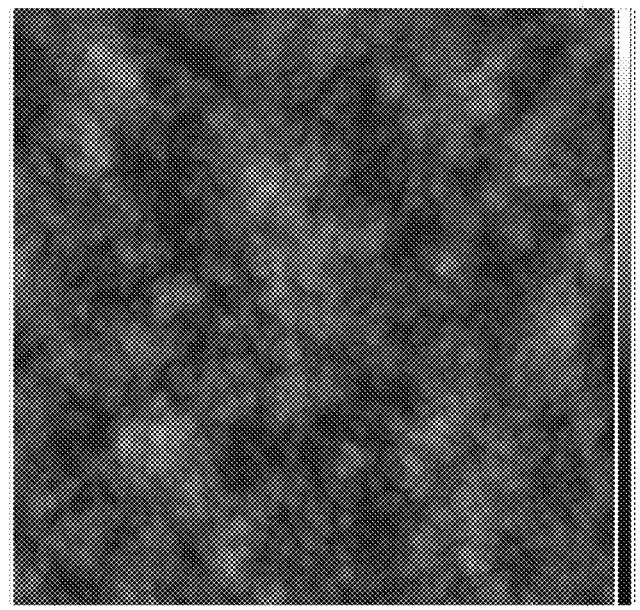
FIG. 4 shows an AFM image of a device according to Example 2.

FIG. 4 shows an AFM image of a device made as in Example 2 with 1,5-dimethyltetralin as the solvent. The average RMS roughness of the OPV:PCBM blend is 0.9 nm (1 µm scan).

The figures show that there is very little effect on the RMS roughness in changing the solvent from DCB to DMT, but there is an improvement in the homogeneity of the phase separated grains.

Examples 6 to 16

The following examples show devices of polymer P1 and PC60BM and PC70BM fabricated from single and dual non-chlorinated solvent formulations. A summary of the performance of each example is given in Table 2. All performance values unless stated represent the averaged values on a single substrate, over a minimum of 5 OPV cells. The cell area is 0.045 cm².

Example 6

A 25 mg/ml formulation in 1,5-dimethyltetralin (1,5-DMT) of polymer P1 and PC70BM (1:2 ratio by mass) was prepared in an inert atmosphere. The solution was heated overnight at 60° C., and heated to 90° C. for 1 hour prior to doctor blading. The doctor blade plate was heated to 90° C. and 40 µl of solution was coated at 30 mm/s. The film was dried at 90° C. for 5 minutes after coating.

Example 7

1,5-Dimethyltetralin and m-xylene are mixed in a 85:15 vol % ratio and the solvent mixture used to prepare a 25 mg/ml formulation of polymer P1 and PC70BM (1:2 ratio by mass) in an inert atmosphere. The solution was heated overnight at 60° C., and heated to 90° C. for 1 hour prior to doctor blading. The doctor blade plate was heated to 90° C. and 60 μl of solution was coated at 30 mm/s. The film was dried at 90° C. for 5 minutes after coating.

Example 8

1,5-Dimethyltetralin and p-cymene are mixed in a 85:15 vol % ratio and the solvent mixture used to prepare a 25 mg/ml formulation of polymer P1 and PC70BM (1:2 ratio by mass) in an inert atmosphere. The solution was heated overnight at 60° C., and heated to 90° C. for 1 hour prior to doctor blading. The doctor blade plate was heated to 90° C. and 60 μl of solution was coated at 30 mm/s. The film was dried at 90° C. for 5 minutes after coating.

Example 9

1,5-Dimethyltetralin and indane are mixed in a 90:10 vol % ratio and the solvent mixture used to prepare a 25 mg/ml formulation of polymer P1 and PC70BM (1:2 ratio by mass) in an inert atmosphere. The solution was heated overnight at 60° C., and heated to 90° C. for 1 hour prior to doctor blading. The doctor blade plate was heated to 90° C. and 40 μl of solution was coated at 30 mm/s. The film was dried at 90° C. for 5 minutes after coating.

Example 10

A 25 mg/ml formulation in 1-methylnaphthalene (1-MN) of polymer P1 and PC60BM (1:2 ratio by mass) was prepared in an inert atmosphere. The solution was heated overnight at 60° C., and heated to 90° C. for 1 hour prior to doctor blading. The doctor blade plate was heated to 90° C. and 40 μl of solution was coated at 40 mm/s. The film was dried at 90° C. for 2 minutes after coating.

Example 11

1-Methylnaphthalene and m-xylene are mixed in a 85:15 vol % ratio and the solvent mixture used to prepare a 25 mg/ml formulation of polymer P1 and PC60BM (1:2 ratio by mass) in an inert atmosphere. The solution was heated overnight at 60° C., and heated to 90° C. for 1 hour prior to doctor blading. The doctor blade plate was heated to 90° C. and 40 μl of solution was coated at 40 mm/s. The film was dried at 90° C. for 2 minutes after coating.

Example 12

1-Methylnaphthalene and indane are mixed in a 70:30 vol % ratio and the solvent mixture used to prepare a 25 mg/ml formulation of polymer P1 and PC60BM (1:2 ratio by mass) in an inert atmosphere. The solution was heated overnight at 60° C., and heated to 90° C. for 1 hour prior to doctor blading. The doctor blade plate was heated to 90° C. and 40 μl of solution was coated at 40 mm/s. The film was dried at 90° C. for 5 minutes after coating.

Example 13

A 25 mg/ml formulation in 1,5-dimethyltetralin of polymer P1 and PC60BM (1:2 ratio by mass) was prepared in an inert atmosphere. The solution was heated overnight at 60° C., and heated to 90° C. for 1 hour prior to doctor blading. The doctor blade plate was heated to 90° C. and 40 μl of solution was coated at 30 mm/s. The film was dried at 90° C. for 5 minutes after coating.

Example 14

1,5-Dimethyltetralin and indane are mixed in a 70:30 vol % ratio and the solvent mixture used to prepare a 25 mg/ml formulation of polymer P1 and PC60BM (1:2 ratio by mass) in an inert atmosphere. The solution was heated overnight at 60° C., and heated to 90° C. for 1 hour prior to doctor blading. The doctor blade plate was heated to 90° C. and 40 μl of solution was coated at 40 mm/s. The film was dried at 90° C. for 5 minutes after coating.

Example 15—Comparison Example

A 25 mg/ml formulation in m-xylene of polymer P1 and PC60BM (1:2 ratio by mass) was prepared in an inert atmosphere. The solution was heated overnight at 60° C., and heated to 90° C. for 1 hour prior to doctor blading. The doctor blade plate was heated to 90° C. and 60 μl of solution was coated at 40 mm/s. The film was dried at 90° C. for 3 minutes after coating.

TABLE 2

| Ex. | Fullerene | Solvent 1 (vol %) | Solvent 2 (vol %) | Voc (V) | Jsc (mA) | FF | PCE (%) |
|---|---|---|---|---|---|---|---|
| 6 | PC70BM | 1,5-DMT (100) | — | 839 | −9.8 | 61 | 5.05 |
| 7 | PC70BM | 1,5-DMT (85) | m-xylene (15) | 824 | −10.7 | 65 | 5.7 |
| 8 | PC70BM | 1,5-DMT (85) | p-cymene (15) | 827 | −10.3 | 62 | 5.3 |
| 9 | PC70BM | 1,5-DMT (90) | Indane(10) | 839 | −9.7 | 66 | 5.34 |
| 10 | PC60BM | 1-MN (100) | — | 826 | −7.7 | 49 | 3.11 |
| 11 | PC60BM | 1-MN (85) | m-xylene(15) | 838 | −6.7 | 59 | 3.33 |
| 12 | PC60BM | 1-MN (70) | Indane(30) | 842 | −7.0 | 67 | 3.95 |
| 13 | PC60BM | 1,5-DMT (100) | — | 834 | −6.8 | 70 | 3.94 |
| 14 | PC60BM | 1,5-DMT (70) | Indane(30) | 831 | −7.5 | 68 | 4.29 |
| 15 Comp. | PC60BM | m-xylene (100) | — | 801 | −5.2 | 65 | 2.64 |

It can be seen that the devices prepared from the formulations of Examples 6-9 (using a PC70BM blend) show the highest values of both $V_{oc}$ and the efficiency. Of the devices using a PC60BM blend, those prepared from the formulations of Examples 10-14 show higher values of both $V_{oc}$ and the efficiency, whereas the device prepared from the formulation of Comparison Example 15 shows lower values of both $V_{oc}$ and the efficiency.

Examples 16-19

The following examples show devices of polymer P1 and PC70BM fabricated from single and dual non-chlorinated solvent formulations. The cell area is 0.045 cm².

Example 16

A 30 mg/ml formulation in 1-methylnaphthalene of polymer P1 and PC70BM (1:2 ratio by mass) was prepared in an inert atmosphere. The solution was heated overnight at 60° C., and heated to 90° C. for 1 hour prior to doctor blading.

The doctor blade plate was heated to 90° C. and 60 μl of solution was coated at 30 mm/s. The film was dried at 90° C. for 5 minutes after coating.

Example 17

1,5-Dimethyltetralin and m-xylene are mixed in a 50:50 vol % ratio and the solvent mixture used to prepare a 25 mg/ml formulation of polymer P1 and PC70BM (1:2 ratio by mass) in an inert atmosphere. The solution was heated overnight at 60° C., and heated to 90° C. for 1 hour prior to doctor blading. The doctor blade plate was heated to 90° C. and 60 μl of solution was coated at 30 mm/s. The film was dried at 90° C. for 5 minutes after coating.

Example 18

1,5-Dimethyltetralin and m-xylene are mixed in a 70:30 vol % ratio and the solvent mixture used to prepare a 25 mg/ml formulation of polymer P1 and PC70BM (1:2 ratio by mass) in an inert atmosphere. The solution was heated overnight at 60° C., and heated to 90° C. for 1 hour prior to doctor blading. The doctor blade plate was heated to 90° C. and 60 μl of solution was coated at 30 mm/s. The film was dried at 90° C. for 5 minutes after coating.

Example 19

1,5-Dimethyltetralin and m-xylene are mixed in a 85:15 vol % ratio and the solvent mixture used to prepare a 25 mg/ml formulation of polymer P1 and PC70BM (1:2 ratio by mass) in an inert atmosphere. The solution was heated overnight at 60° C., and heated to 90° C. for 1 hour prior to doctor blading. The doctor blade plate was heated to 90° C. and 60 μl of solution was coated at 30 mm/s. The film was dried at 90° C. for 5 minutes after coating.

FIGS. 5-8 show AFM images of the device active layer as prepared according to examples 16-19. The images show that a variety of different solvents and solvent formulation ratios can be used to influence the performance of the OPV device produced from polymer P1 and PC70BM. It also illustrates that there is no significant relationship between PCE and average RMS roughness (Rg), as observed in prior art like US 2010/0043876 A1.

Figure 5:
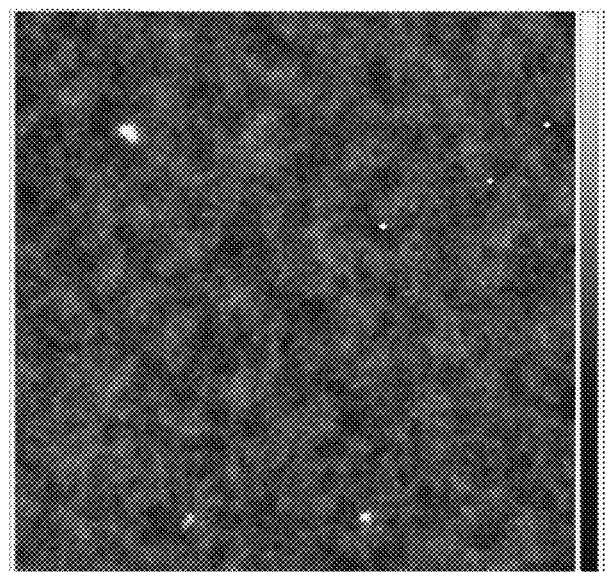
FIG. 5 shows an AFM image of a device according to Example 16.

FIG. 5 shows an AFM image of a device prepared according to example 16. It exhibits a RMS roughness of 1.1 nm and a PCE of 4.07%

Figure 6:
FIG. 6 shows an AFM image of a device according to Example 17.

FIG. 6 shows an AFM image of a device prepared according to example 17. It exhibits a RMS roughness of 1.2 nm and a PCE of 4.90%

Figure 7:
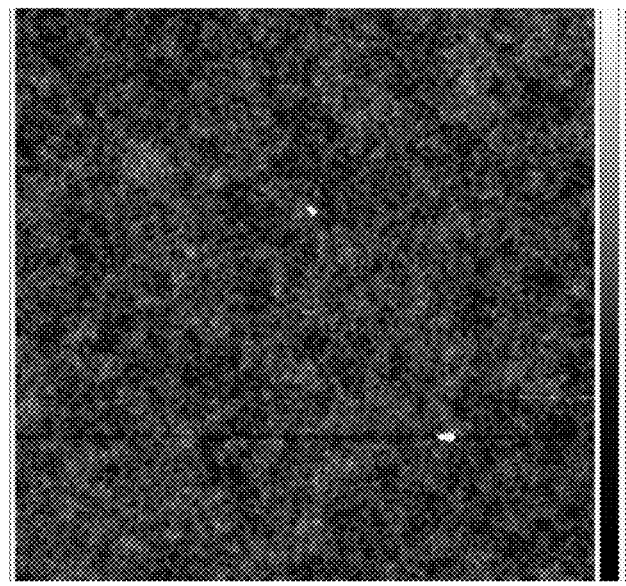
FIG. 7 shows an AFM image of a device according to Example 18.

FIG. 7 shows an AFM image of a device prepared according to example 18. It exhibits a RMS roughness of 1.5 nm and a PCE of 5.44%

Figure 8:
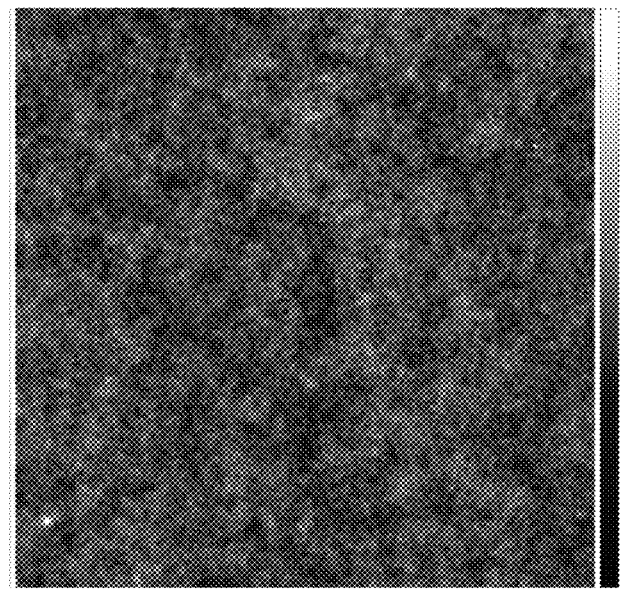
FIG. 8 shows an AFM image of a device according to Example 19.

FIG. 8 shows an AFM image of a device prepared according to example 19. It exhibits a RMS roughness of 1.2 nm and a PCE of 4.46%

Figure 9:
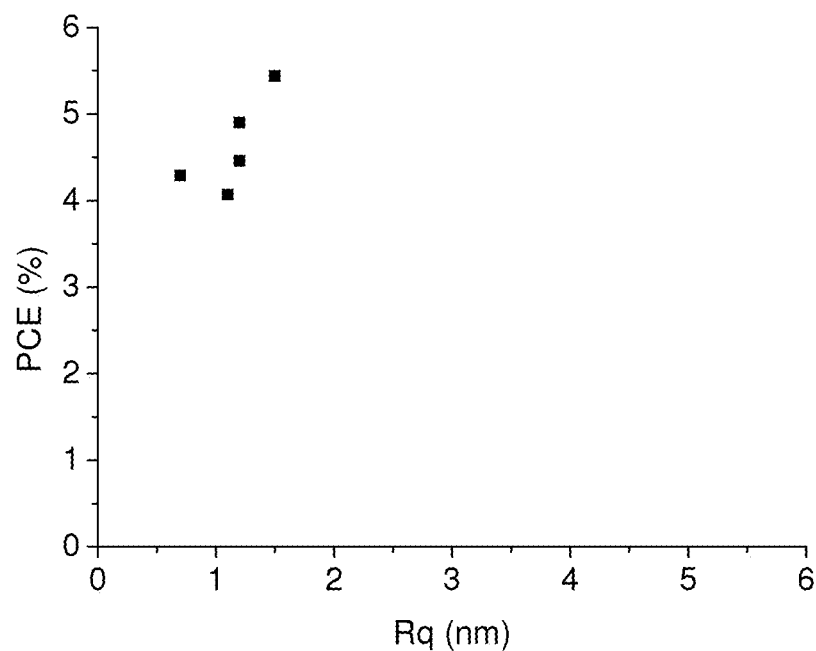
FIG. 9 shows a graph showing the relationship between RMS average roughness and PCE for the devices according to Examples 16-19 as shown in FIGS. 5-7.

FIG. 9 shows a graph showing the relationship between RMS average roughness and PCE for the devices of Examples 16-19 as presented in FIGS. 5-7. It can be seen that the roughness does only have little influence on the PCE. The range of roughness in the polymer P1 examples is in the region of 0.5-2 nm, which is far lower than that exemplified with P3HT in prior art like US 2010/0043876 A1 (8-10 nm).

Examples 20-21

The following examples show devices of polymer P2 and PC70BM fabricated from a DCB formulation and from a dual non-chlorinated solvent formulation, respectively. The cell area is 0.045 cm².

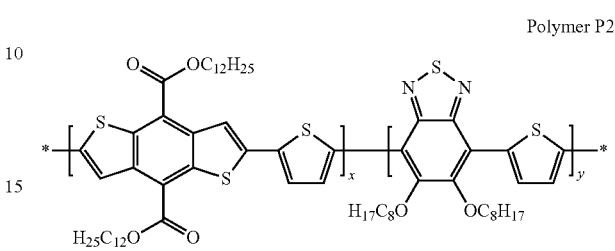

Polymer P2

$M_n$=22300, $M_w$=46600, PDI=2.09, HOMO=−5.45 eV, LUMO=−3.74 eV, Eg=1.71 eV

Example 20—Comparison Example

A 30 mg/ml formulation in 1,2-dichlorobenzene of polymer P2 and PC60BM (1:2 ratio by mass) was prepared in an inert atmosphere. The solution was heated overnight at 60° C., and heated to 70° C. for 1 hour prior to doctor blading. The doctor blade plate was heated to 70° C. and 40 μl of solution was coated at 40 mm/s. The film was dried at 70° C. for 2 minutes after coating.

Example 21

1-Methylnaphthalene and 1,5-dimethyltetralin are mixed in a 85:15 vol % ratio and the solvent mixture used to prepare a 30 mg/ml formulation of polymer P2 and PC60BM (1:2 ratio by mass) in an inert atmosphere. The solution was heated overnight at 60° C., and heated to 90° C. for 1 hour prior to doctor blading. The doctor blade plate was heated to 90° C. and 40 μl of solution was coated at 40 mm/s. The film was dried at 90° C. for 5 minutes after coating.

Figure 10:
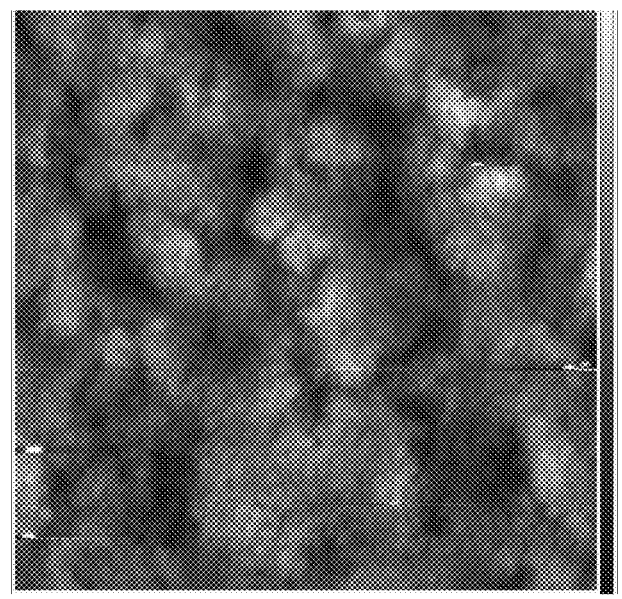
FIG. 10 shows an AFM image of a device according to Example 20.

FIG. 10 shows an AFM image of a device made as in Example 20 with 1,2-diclorobenzene as the solvent, and polymer P2 as the donor polymer. The average RMS roughness of the OPV:PCBM blend is 1.9 nm.

Figure 11:
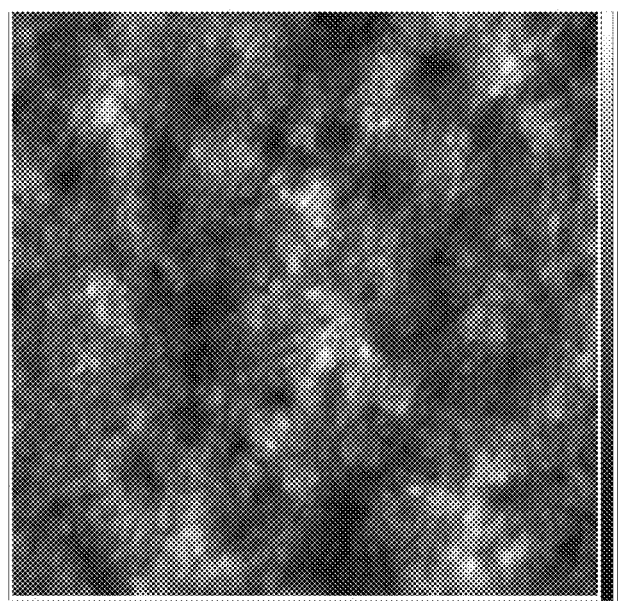
FIG. 11 shows an AFM image of a device according to Example 21.

FIG. 11 shows an AFM image of a device made as in Example 21 with a mixture of 1-methylnaphthalene and 1,5-dimethyltetralin in a 85:15 vol % ratio as the formulation solvent. The average RMS roughness of the OPV:PCBM blend is 1.9 nm.

The figures show that there is very little effect on the RMS roughness in changing the solvent form DCB to MN/DMT. It also shows how by improving the phase separation homogeneity the PCE is increased from 5.3 to 6.15% when using polymer P2 as the OPV donor polymer.

The invention claimed is:
1. A formulation comprising
at least one p-type organic semiconductor,
at least one n-type organic semiconductor,
at least one first solvent, which is tetralin that is substituted by two or more alkyl groups, and
at least one second solvent which is different from said first solvent and is selected from the group consisting of alkylated benzene, alkoxylated benzene, indane, alkylated indane, alkoxylated indane, tetralin, alkylated tetralin, naphthalene, alkylated naphthalene, anisole, alkylated anisole, linear ketones, cyclic ketones, aromatic ethers, aliphatic ethers, aromatic and aliphatic ethers, aromatic alcohols, optionally substituted thiophenes, benzothiophenes, alkoxylated naphthalene, substituted benzothiazoles, alkyl benzoates and aryl benzoates, wherein the solubility of the n-type organic semiconductor in the first solvent is higher than in the second solvent, and the solubility of the p-type organic semiconductor in the second solvent is higher than in the first solvent.

2. The formulation according to claim 1, wherein the concentration of the at least one first solvent is the same as or higher than the concentration of the at least one second solvent.

3. The formulation according to claim 1, wherein the first solvent has a boiling point ≥150° C.

4. The formulation according to claim 1, wherein the second solvent has a boiling point ≥100° C.

5. The formulation according to claim 1, wherein the boiling point of the first solvent is greater than the boiling point of the second solvent.

6. The formulation according to claim 1, which it is free of chlorinated solvents.

7. The formulation according to claim 1, wherein the second solvent which is different from said first solvent is selected from the group consisting of xylene, cymene, indane, anisole, veratrol, dimethylanisole, tetralin, 1,5-dimethyltetralin, naphthalene, 1-methylnaphthalene, 1-ethyl-naphthalene, 2-ethyl-naphthalene, 1,2-dimethylnaphthalene, 1,3-dimethylnaphthalene, 1,4-dimethylnaphthalene, 2,6-dimethylnaphthalene, 2,7-diisopropyl-naphthalene, cyclopentanone, and cyclohexanone.

8. The formulation according to claim 1, wherein the second solvent which is different from said first solvent is selected from the group consisting of m-xylene, p-cymene, veratrole, 1,5-dimethyltetralin, 1-methylnaphthalene, 2,4-dimethylanisole and indane.

9. The formulation according to claim 1, 1,2-dihydronapthalene, decalin, diphenyl ether, cyclohexyl benzene, methyl phenyl acetate, phenyl acetate, benzyl acetate, ethyl benzoate, gamma-terpinene, benzothiophene, thiophene, 1-methoxynaphthalene, benzyl alcohol, cyclohexanol, indene,1,4-dioxane, ethylene glycol monobutyl ether, diethyl ether, N-methylpyrrolidone, diethyl phthalate, benzyl benzoate, ethyl benzoate, acetophenone, propiophenone, 2-heptanone, cyclohexanone, benzothiazole, benzonitrile, bicyclohexyl, and methyl isobutyl ketone.

10. The formulation according to claim 1, wherein the ratio of the first and the second solvent is 50:50 to 95:5 parts by weight.

11. The formulation according to claim 1, wherein the p-type organic semiconductor is a conjugated organic polymer.

12. The formulation according to claim 1, wherein the p-type organic semiconductor is a non-crystalline or semi-crystalline conjugated organic polymer.

13. The formulation according to claim 1, wherein the p-type organic semiconductor is a conjugated organic polymer with a bandgap below 2.1 eV.

14. The formulation according to claim 1, wherein the n-type organic semiconductor is a fullerene or fullerene derivative.

15. A formulation comprising
at least one p-type organic semiconductor,
at least one n-type organic semiconductor,
at least one first solvent, which is 1,5-dimethyltetralin, and
at least one second solvent which is different from said first solvent and is selected from the group consisting of alkylated benzene, alkoxylated benzene, indane, alkylated indane, alkoxylated indane, tetralin, alkylated tetralin, naphthalene, alkylated naphthalene, anisole, alkylated anisole, linear ketones, cyclic ketones, aromatic ethers, aliphatic ethers, aromatic and aliphatic ethers, aromatic alcohols, optionally substituted thiophenes, benzothiophenes, alkoxylated naphthalene, substituted benzothiazoles, alkyl benzoates and aryl benzoates,
wherein the solubility of the n-type organic semiconductor in the first solvent is higher than in the second solvent, and the solubility of the p-type organic semiconductor in the second solvent is higher than in the first solvent.

\* \* \* \* \*